US 12,406,935 B2

(12) United States Patent
Lee et al.

(10) Patent No.: US 12,406,935 B2
(45) Date of Patent: *Sep. 2, 2025

(54) SEMICONDUCTOR DEVICE PACKAGE

(71) Applicant: SUZHOU LEKIN SEMICONDUCTOR CO., LTD., Suzhou (CN)

(72) Inventors: Sang Youl Lee, Seoul (KR); Ki Man Kang, Seoul (KR); Eun Dk Lee, Seoul (KR)

(73) Assignee: SUZHOU LEKIN SEMICONDUCTOR CO., LTD., Taicang (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/405,806

(22) Filed: Jan. 5, 2024

(65) Prior Publication Data
US 2024/0222285 A1    Jul. 4, 2024

Related U.S. Application Data

(63) Continuation of application No. 16/979,734, filed as application No. PCT/KR2019/004032 on Apr. 5, 2019, now Pat. No. 11,894,307.

(30) Foreign Application Priority Data

Apr. 5, 2018    (KR) .................. 10-2018-0039893
Apr. 27, 2018   (KR) .................. 10-2018-0049083

(51) Int. Cl.
  *H01L 23/538*   (2006.01)
  *H01L 25/075*   (2006.01)
  *H10H 20/857*   (2025.01)

(52) U.S. Cl.
  CPC ........ *H01L 23/5386* (2013.01); *H01L 25/075* (2013.01); *H10H 20/857* (2025.01)

(58) Field of Classification Search
  CPC ............ H01L 33/00–648; H01L 25/075–0753
  See application file for complete search history.

(56) References Cited

U.S. PATENT DOCUMENTS

| 2004/0235210 A1 | 11/2004 | Tamura et al. |
| 2011/0193123 A1* | 8/2011 | Moon ............... H01L 33/382 |
| | | 257/E33.072 |

(Continued)

FOREIGN PATENT DOCUMENTS

| JP | 2015-173222 A | 10/2015 |
| JP | 2016-92235 A | 5/2016 |

(Continued)

OTHER PUBLICATIONS

Machine translation of KR 10-2016-0059128, published May 26, 2016 (Year: 2016).

*Primary Examiner* — Tucker J Wright
(74) *Attorney, Agent, or Firm* — Birch, Stewart, Kolasch & Birch, LLP

(57) ABSTRACT

A semiconductor device package includes a substrate; and a plurality of semiconductor structures disposed to be spaced apart from each other at a central portion of the substrate. Further, the semiconductor structure is disposed on the substrate and includes a first conductivity-type semiconductor layer, a second conductivity-type semiconductor layer disposed on the first conductivity-type semiconductor layer, and an active layer disposed between the first conductivity-type semiconductor layer and the second conductivity-type semiconductor layer. The semiconductor device package also includes a plurality of first interconnection lines disposed between the substrate and the plurality of semiconductor structures and electrically connected to the first conductivity-type semiconductor layer; and a plurality of second interconnection lines disposed between the substrate (Continued)

and the plurality of semiconductor structures and electrically connected to the second conductivity-type semiconductor layer.

17 Claims, 26 Drawing Sheets

(56) References Cited

U.S. PATENT DOCUMENTS

| | | |
|---|---|---|
| 2014/0048839 A1 | 2/2014 | Jeong et al. |
| 2015/0262978 A1 | 9/2015 | Shibata |

FOREIGN PATENT DOCUMENTS

| | | |
|---|---|---|
| KR | 10-2012-0114921 A | 10/2012 |
| KR | 10-2014-0024580 A | 3/2014 |
| KR | 10-2014-0032163 A | 3/2014 |
| KR | 10-2015-0136852 A | 12/2015 |
| KR | 10-2016-0059128 A | 5/2016 |
| KR | 10-2018-0005896 A | 1/2018 |

* cited by examiner

[Fig. 4]
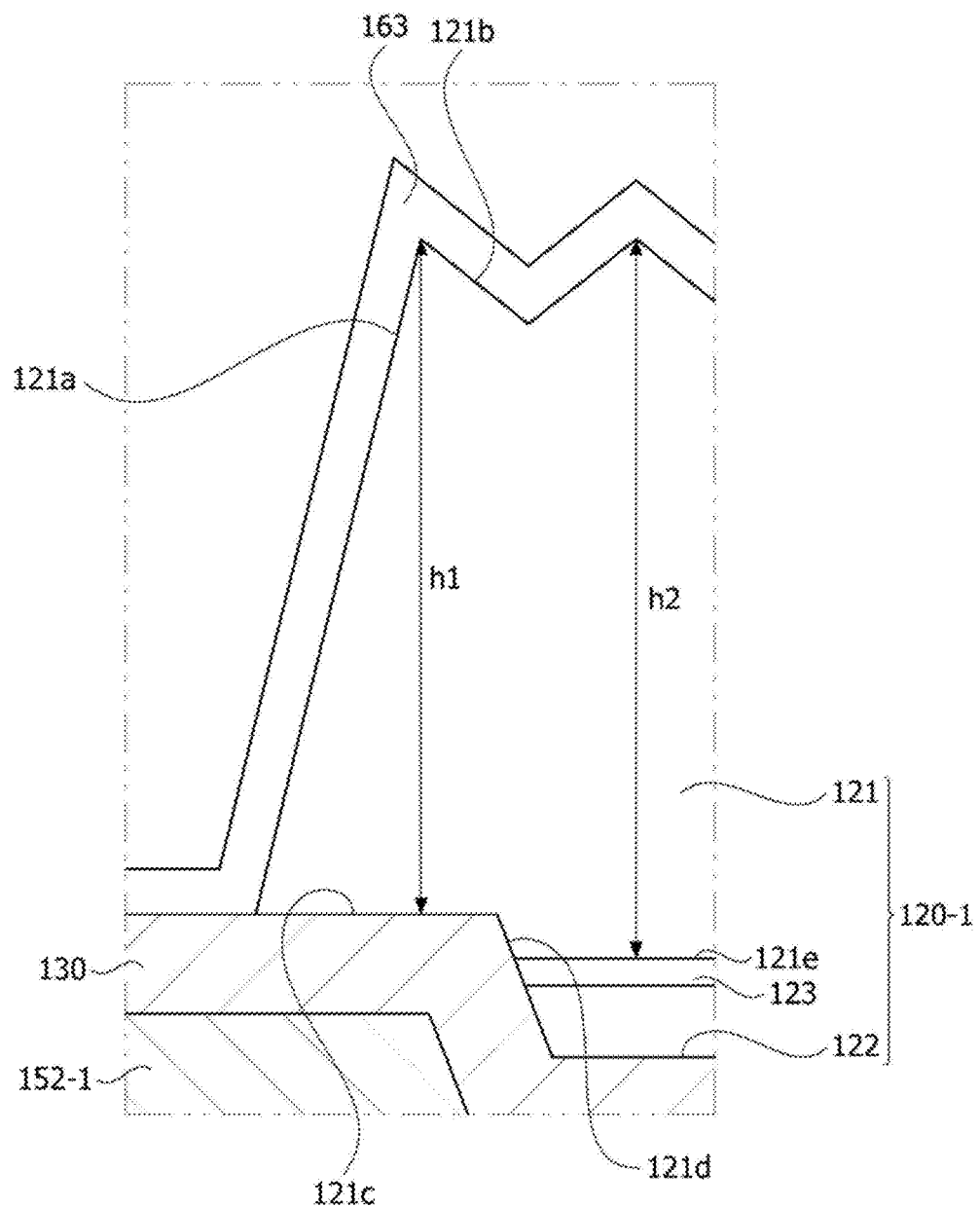

[Fig. 5]
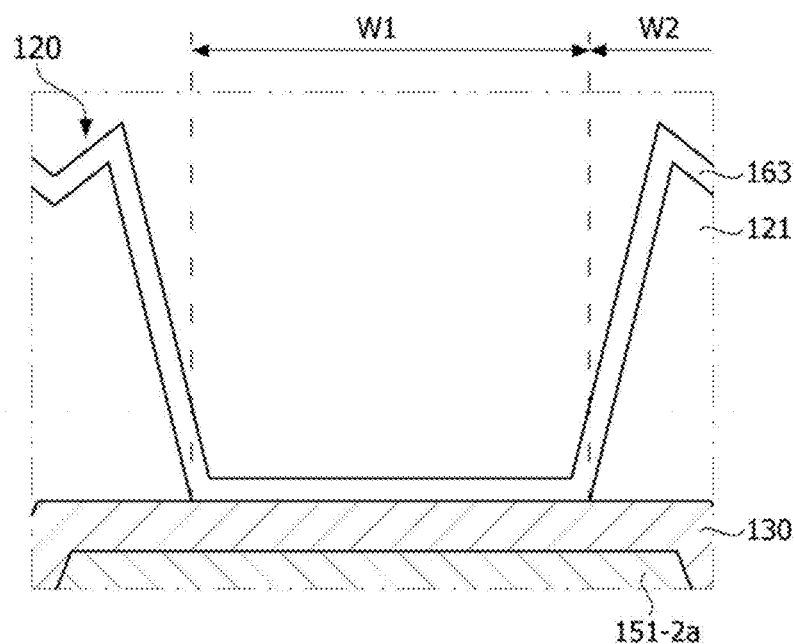
[Fig. 6]
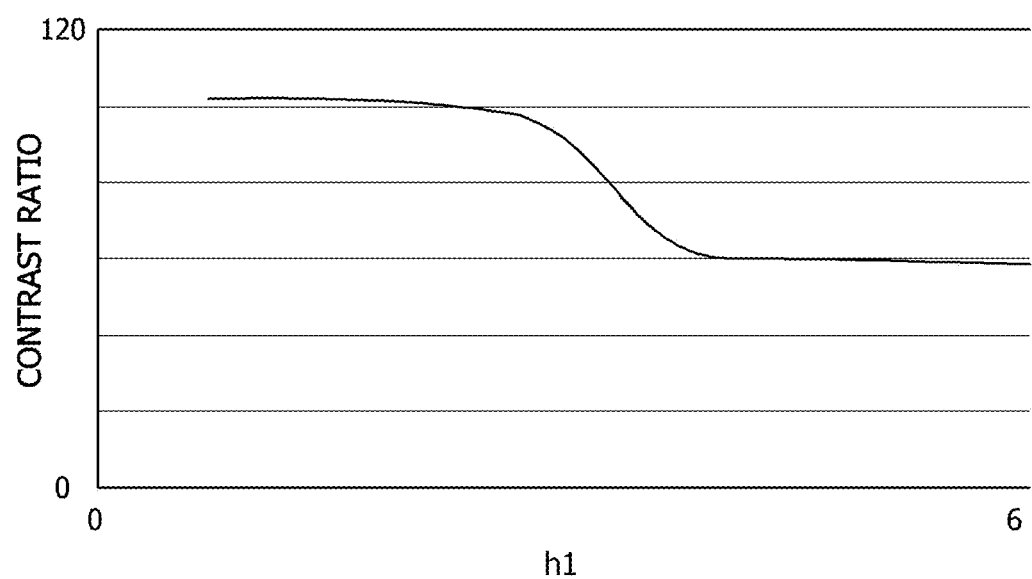

[Fig. 7]
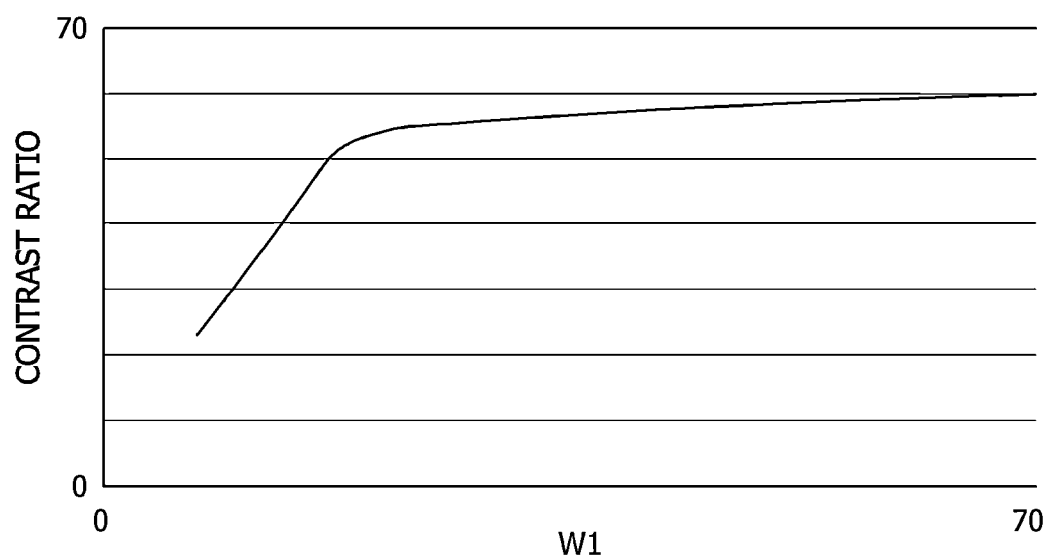

[Fig. 8]
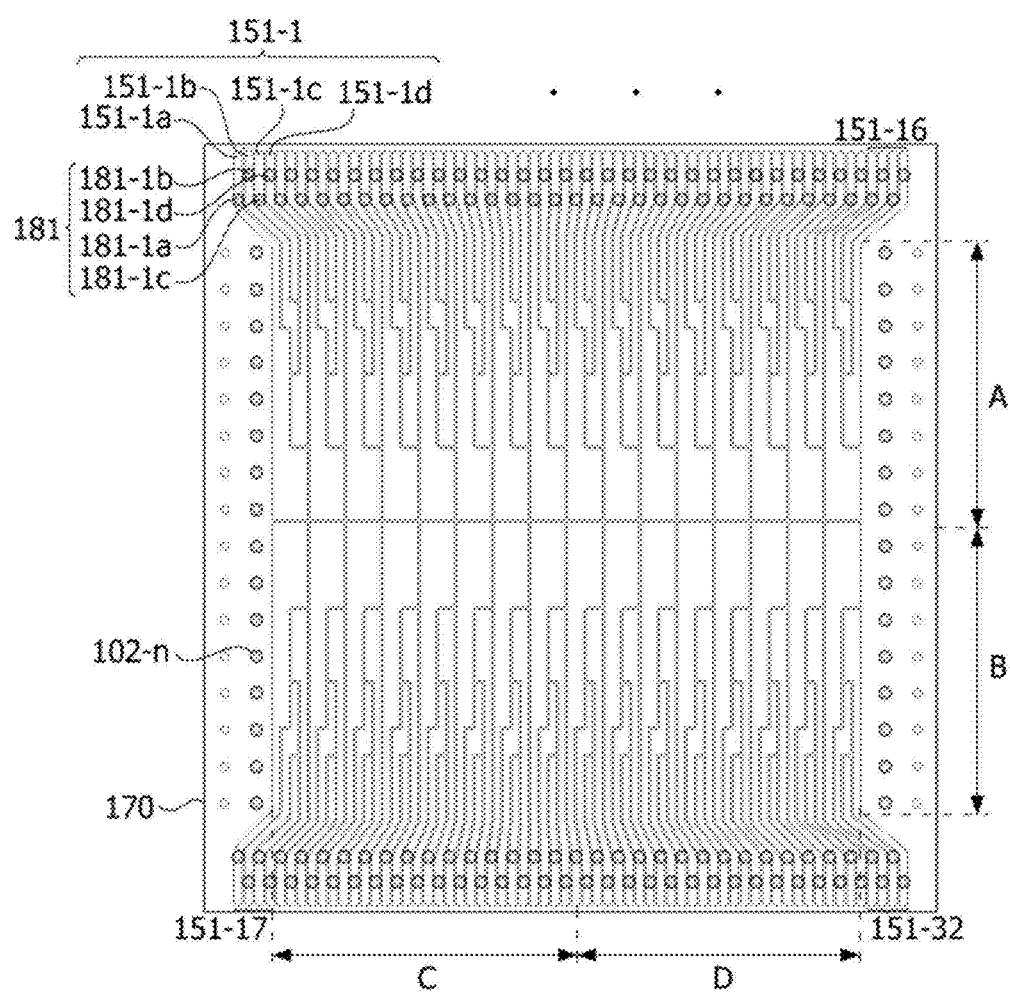

[Fig. 9]
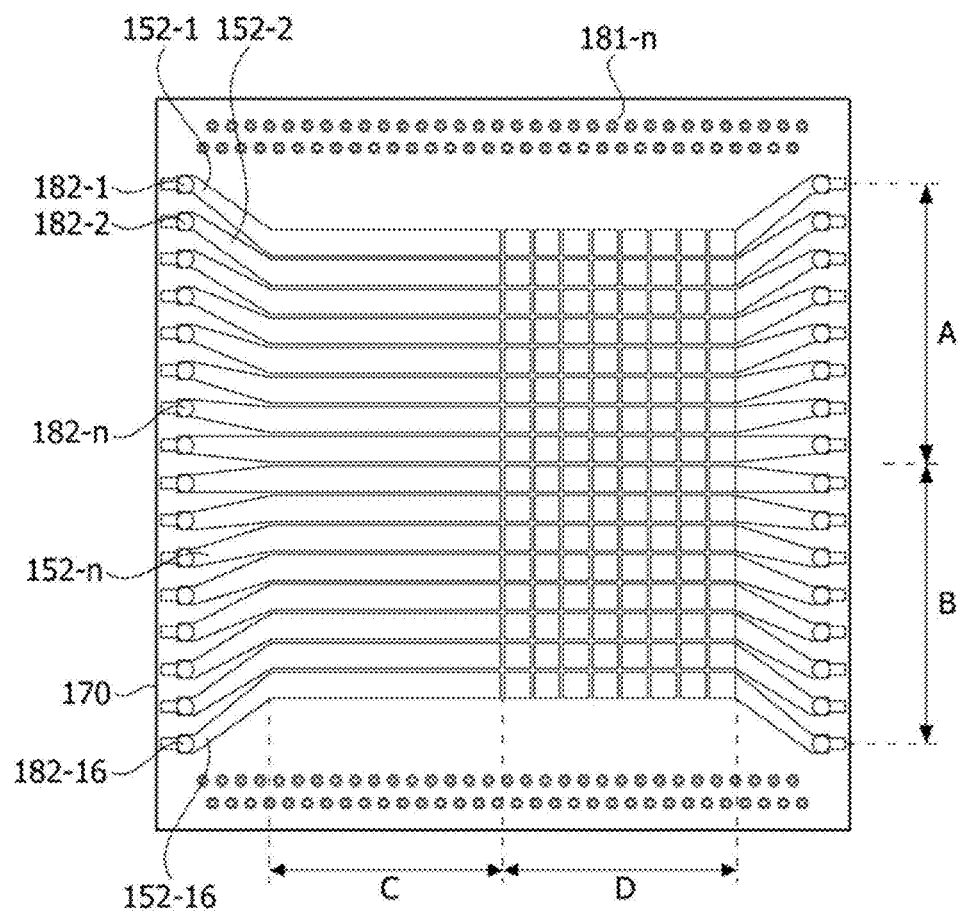

[Fig. 10]
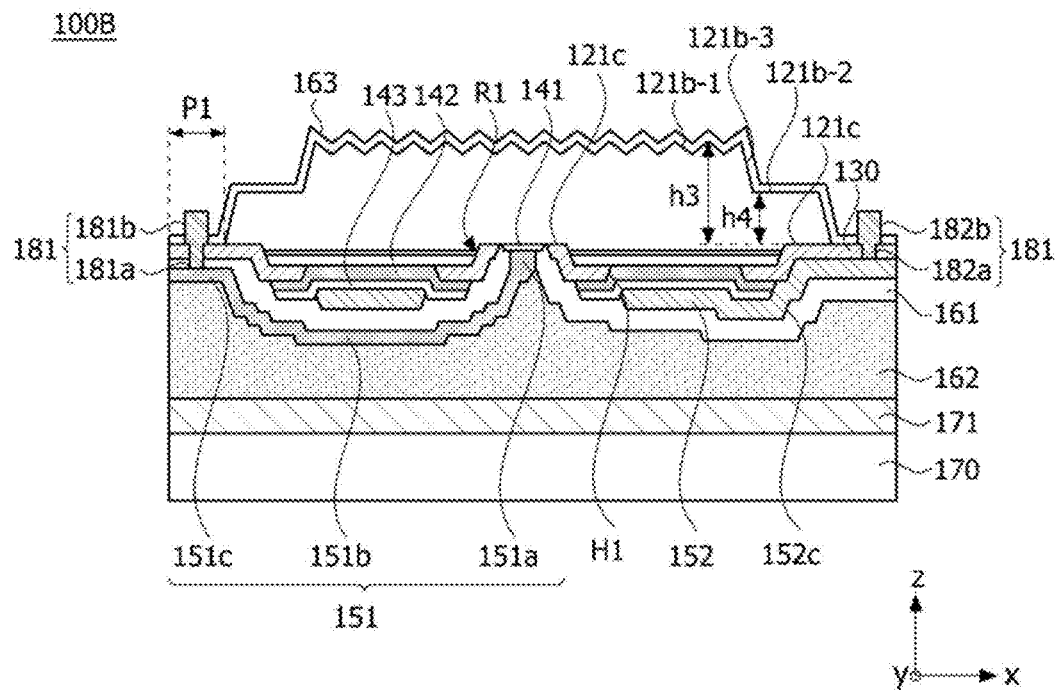
[Fig. 11]
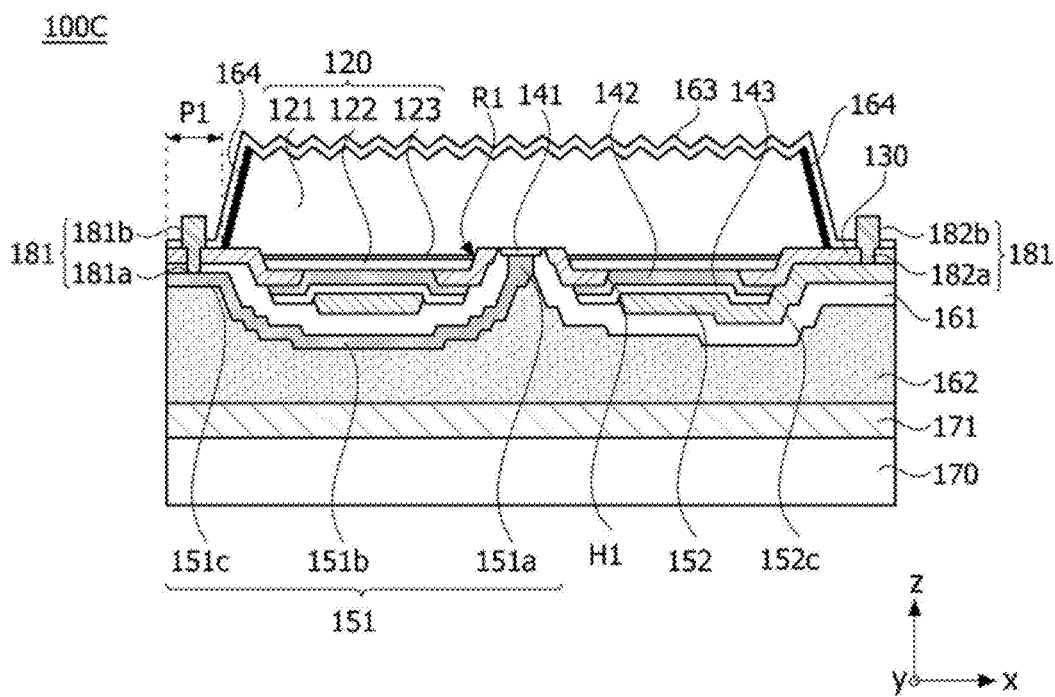

[Fig. 13]
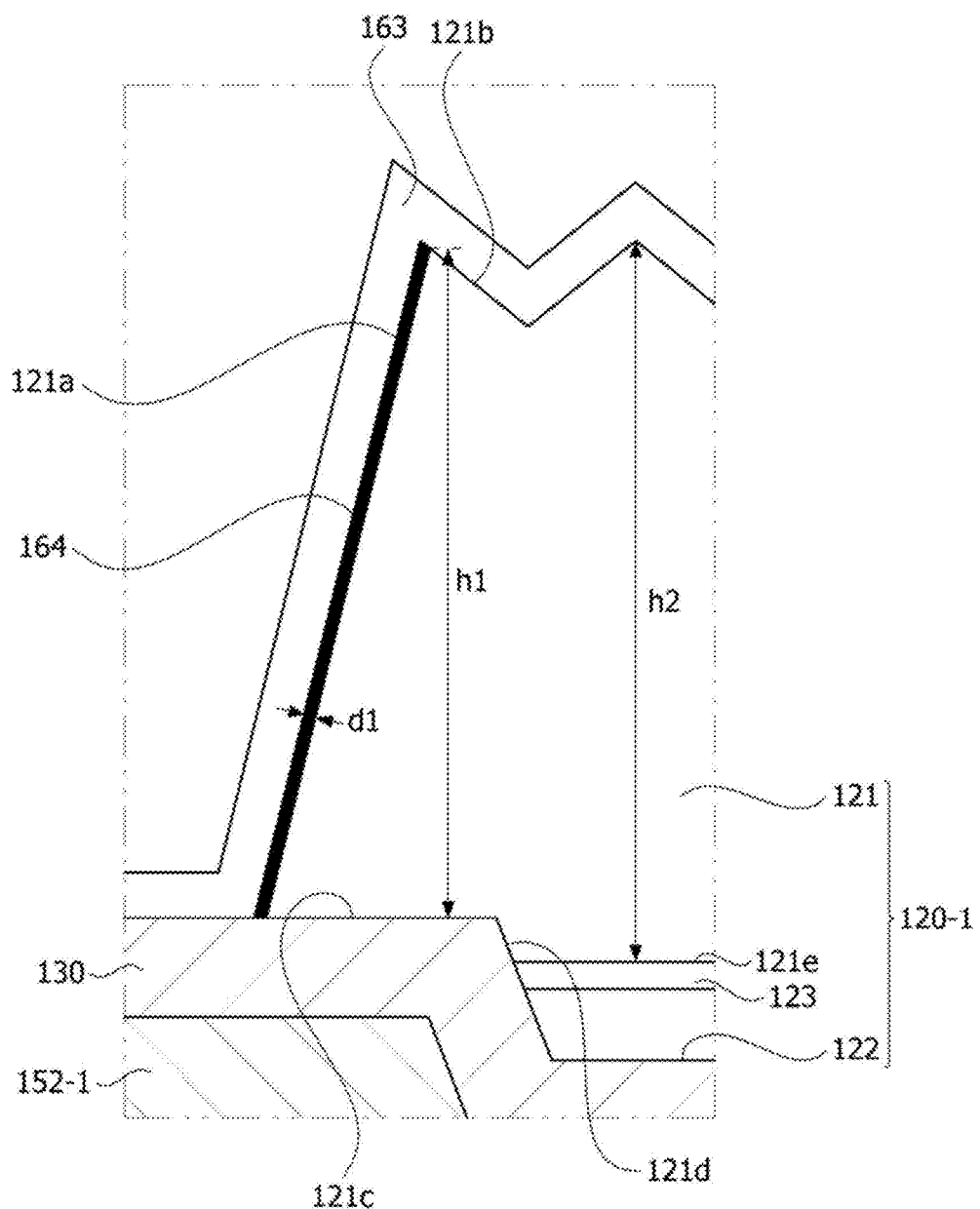

[Fig. 14]
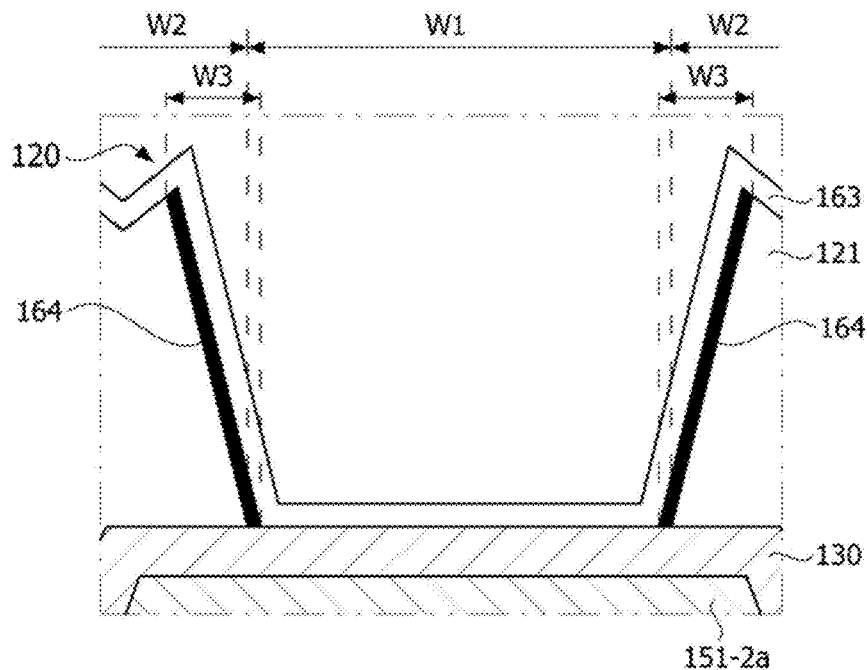
[Fig. 15]
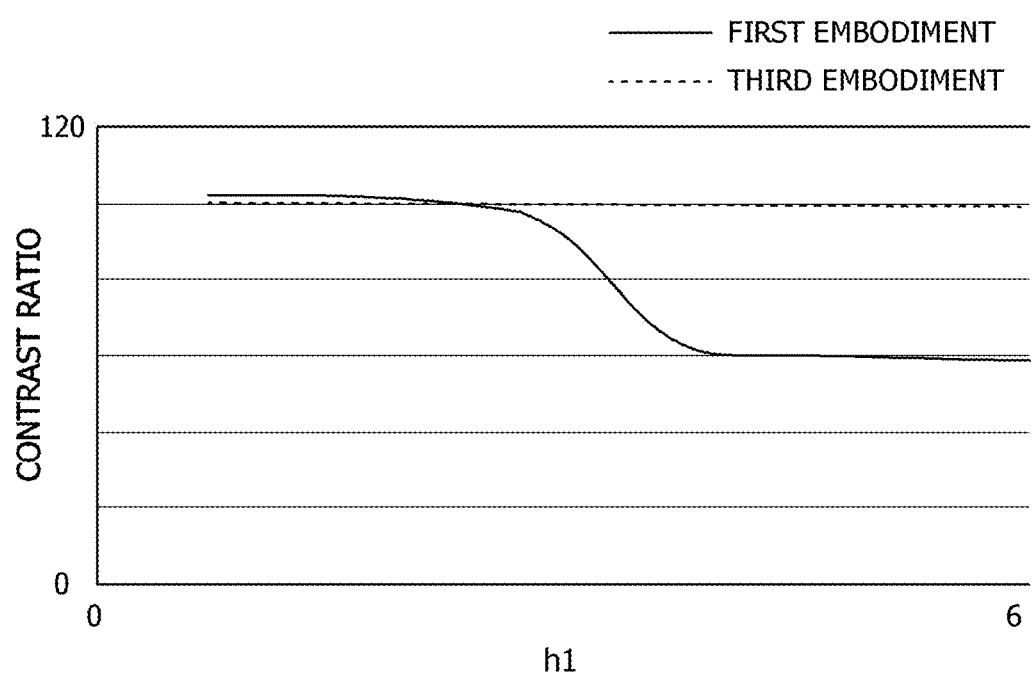

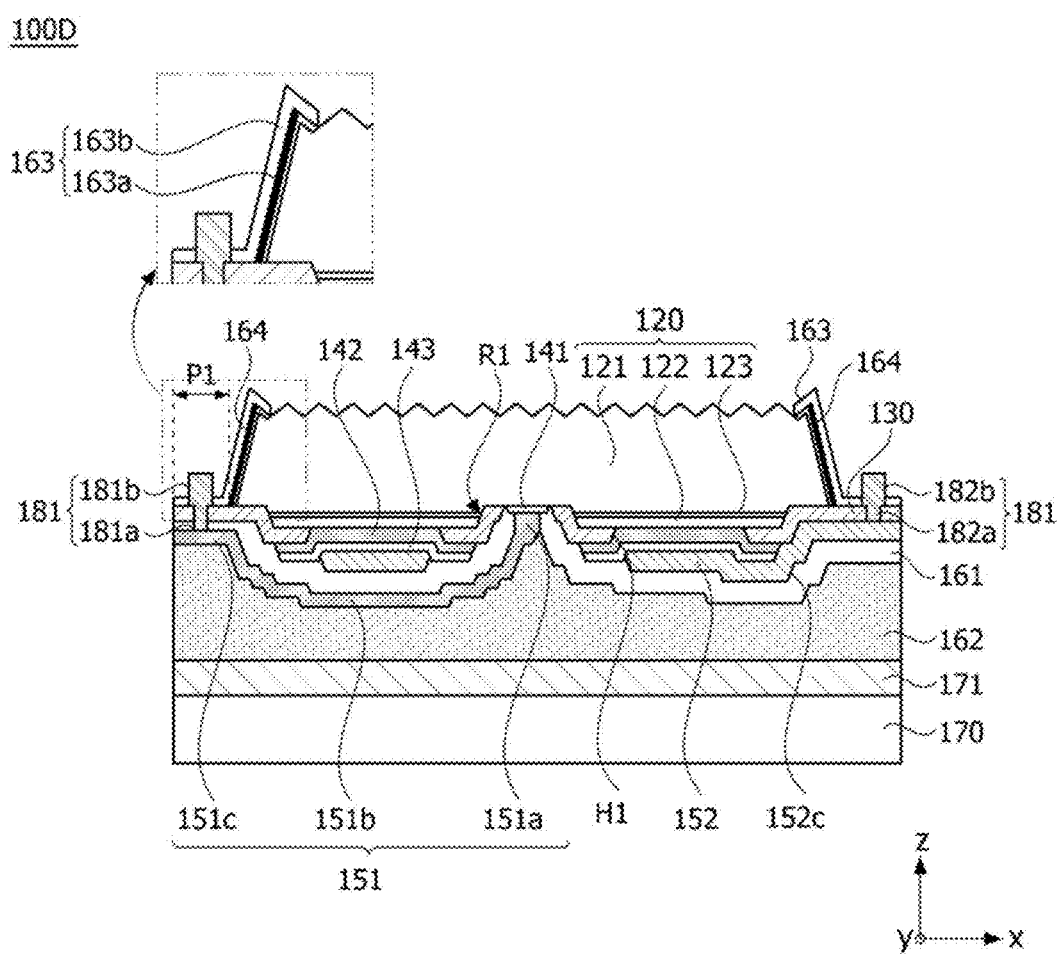
[Fig. 16]

[Fig. 17]
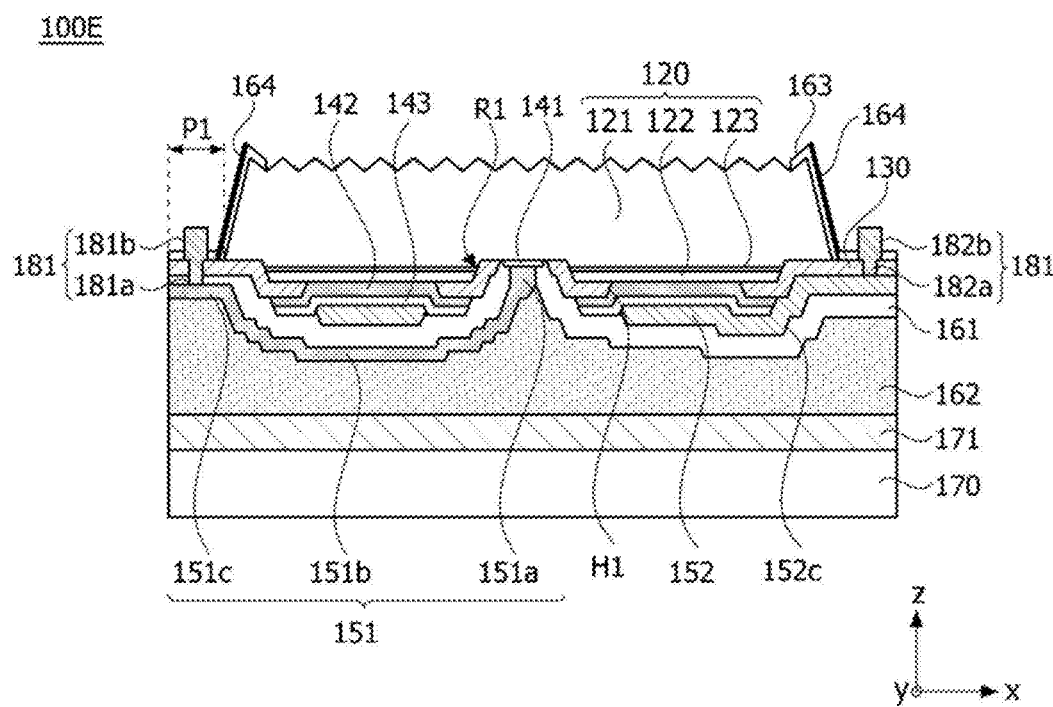

[Fig. 18a]
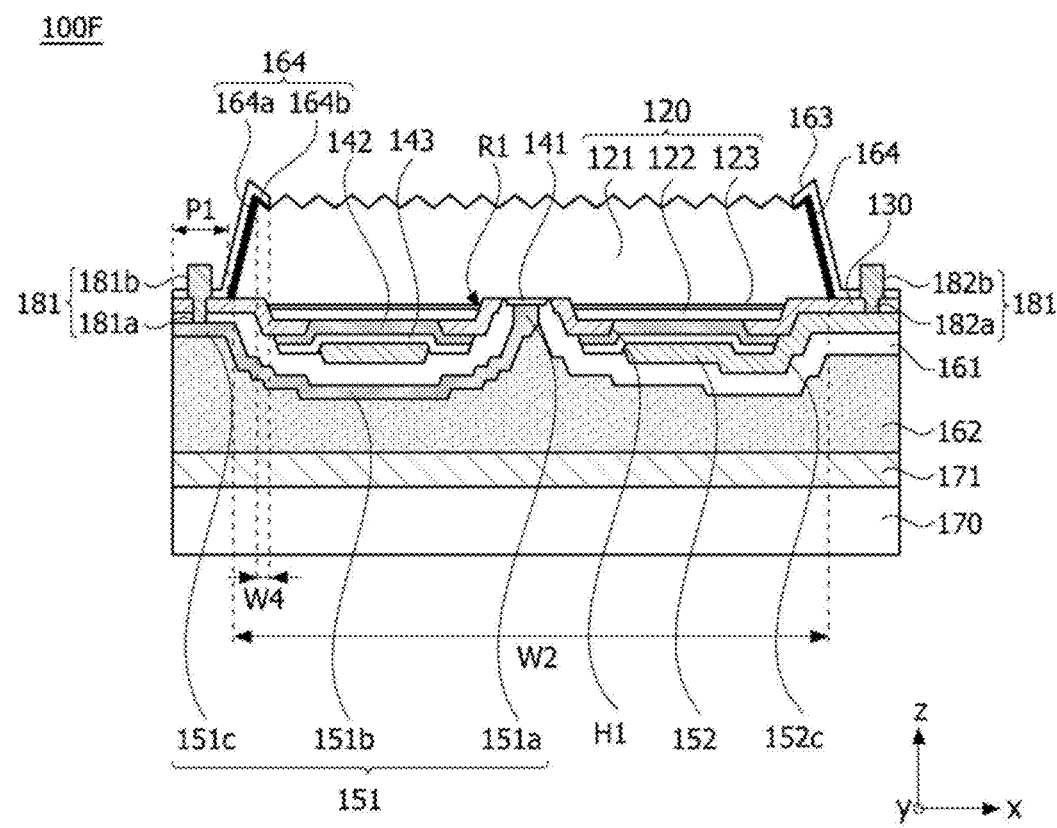

[Fig. 18b]
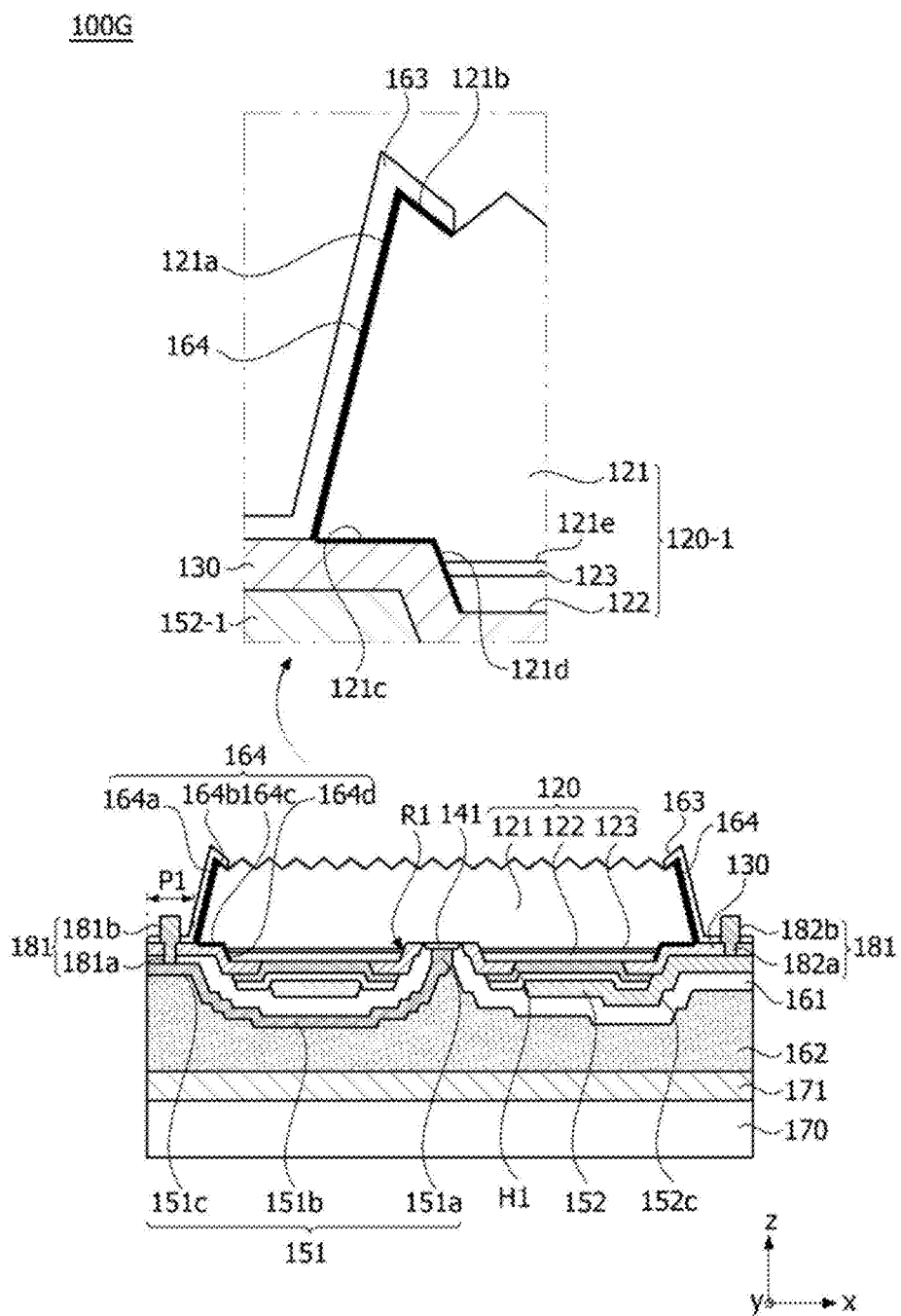

[Fig. 18c]
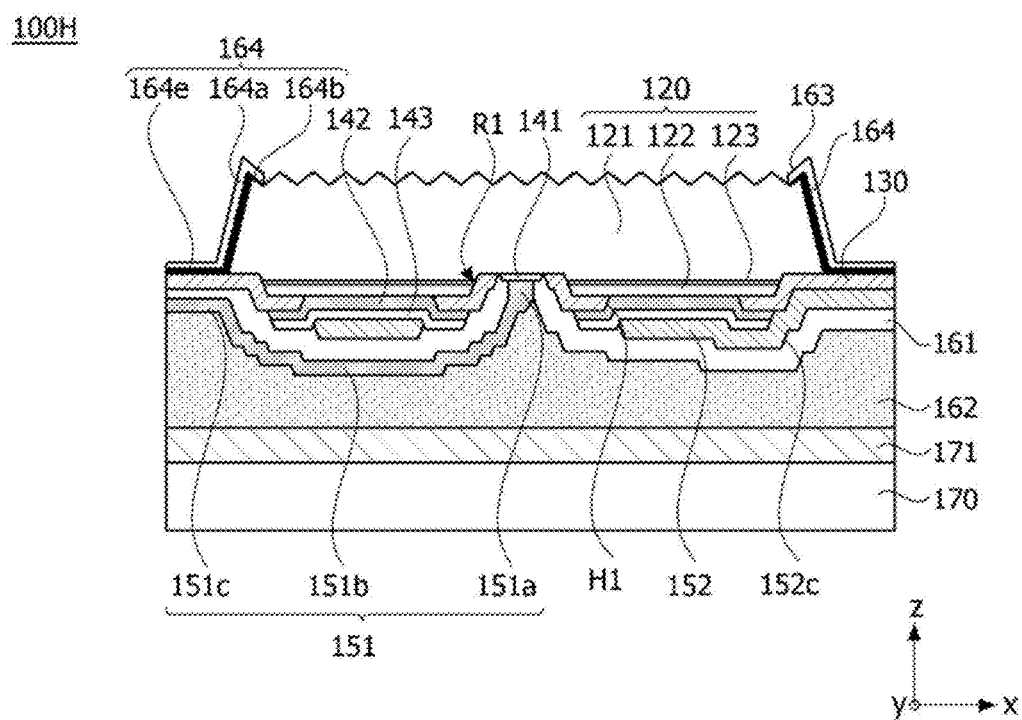

[Fig. 19]
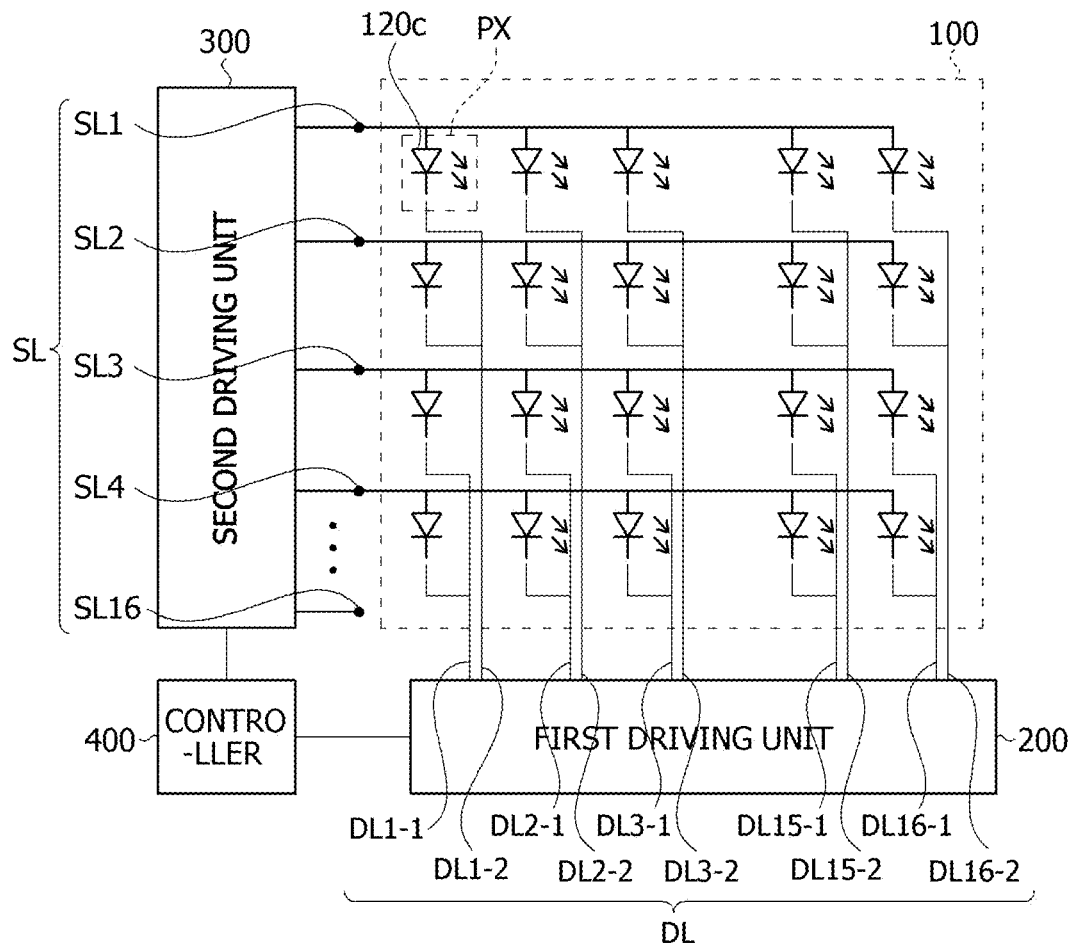
[Fig. 20a]
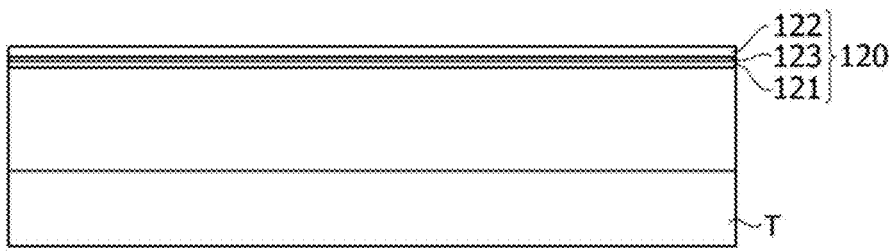

[Fig. 20b]
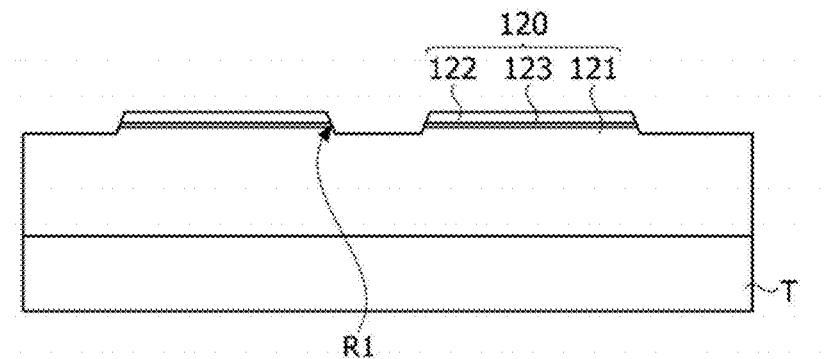
[Fig. 20c]
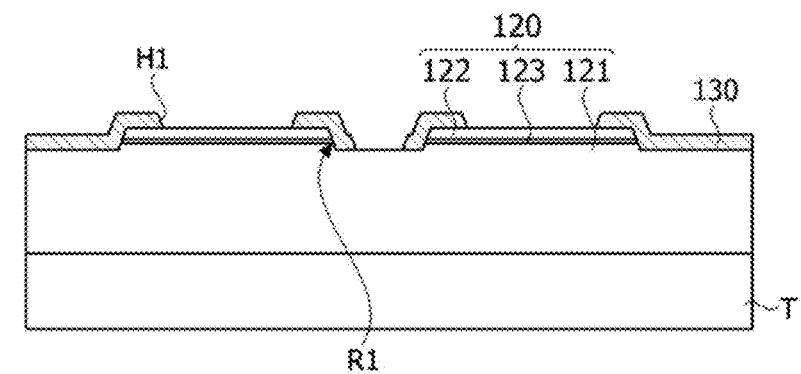
[Fig. 20d]
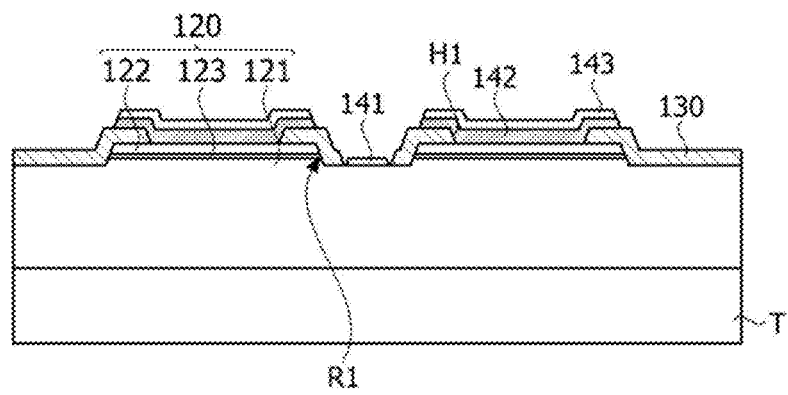

[Fig. 20e]
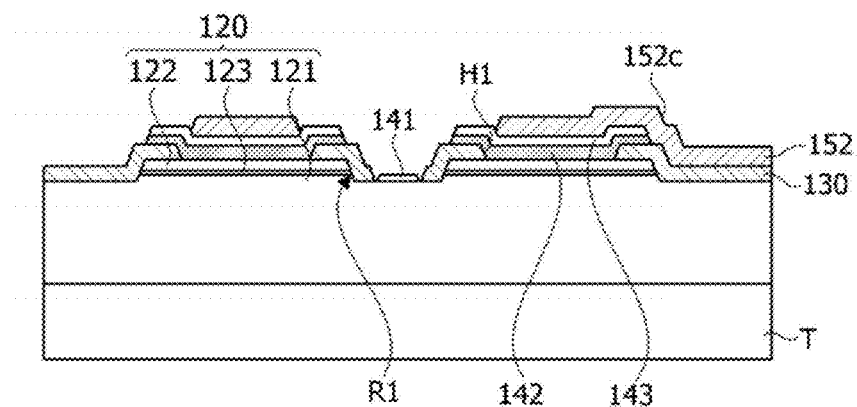
[Fig. 20f]
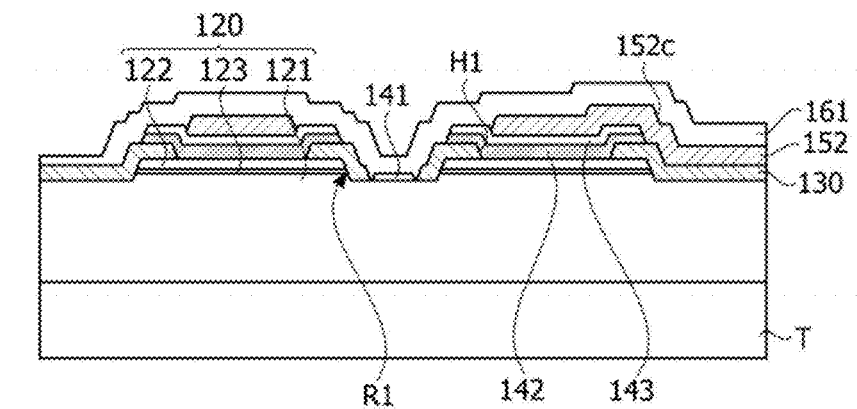

[Fig. 20g]
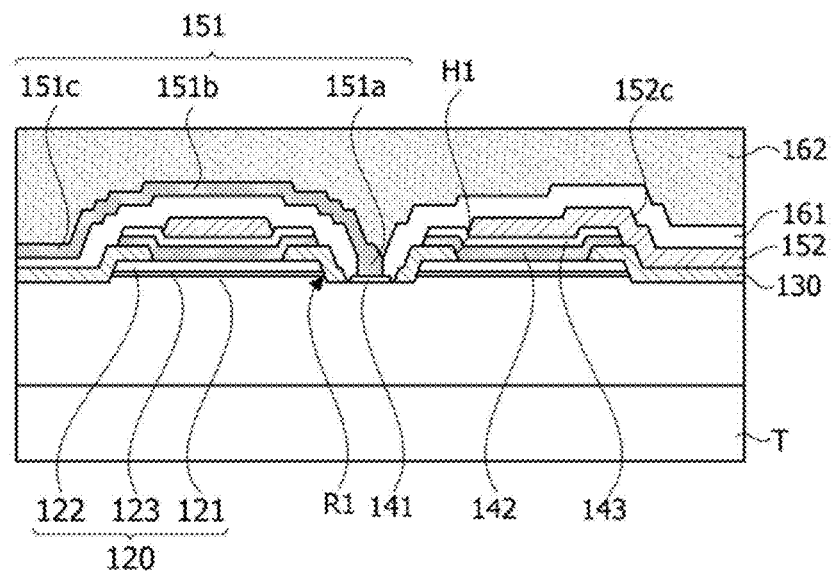
[Fig. 20h]
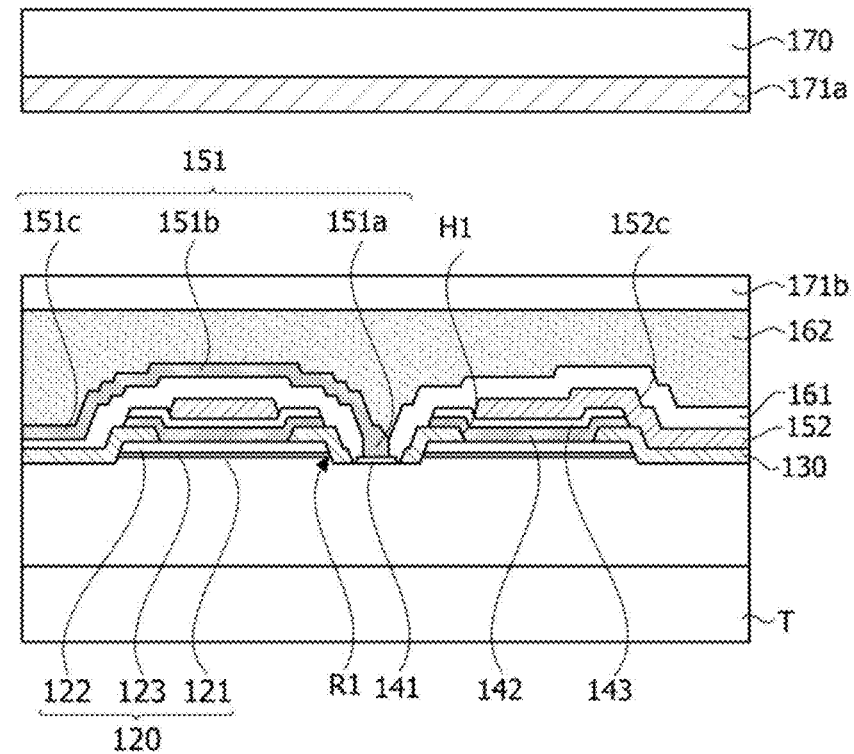

[Fig. 20i]
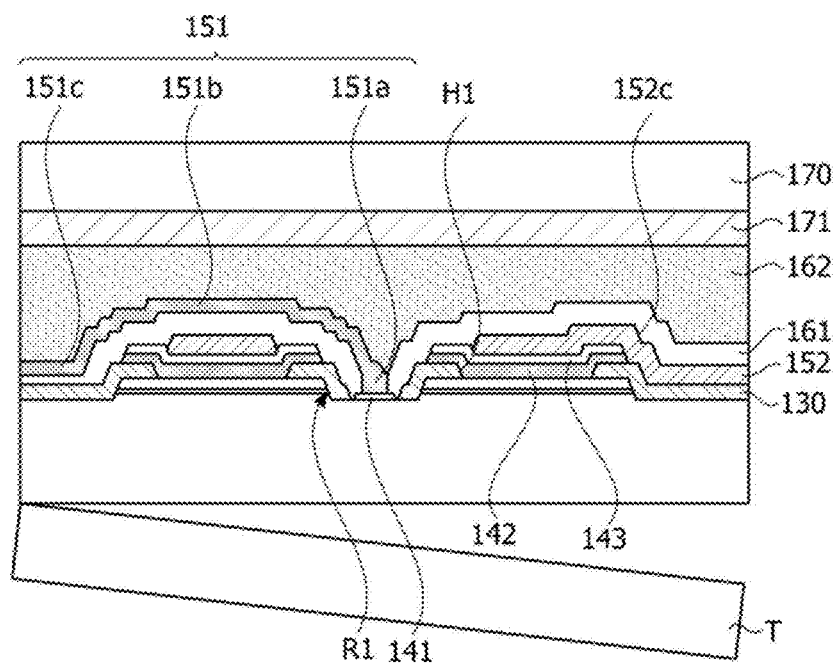
[Fig. 20j]
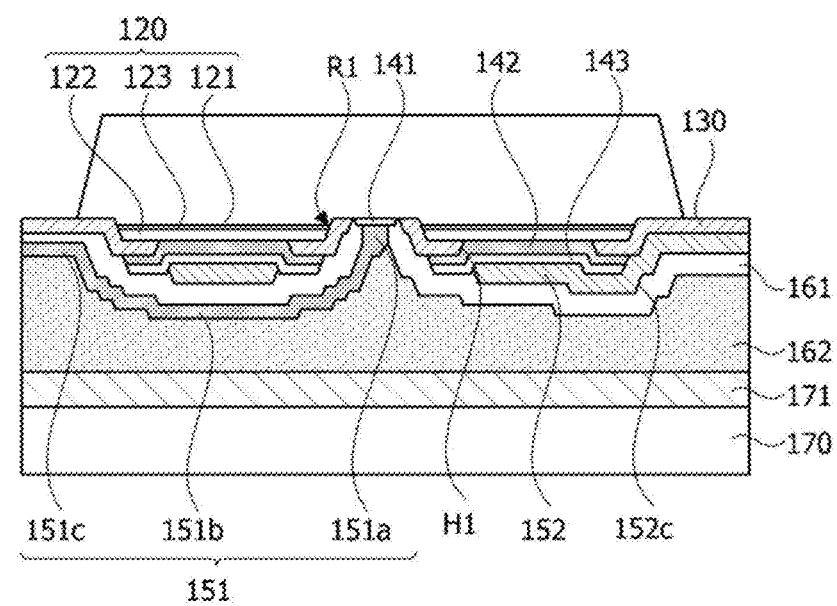

[Fig. 20k]
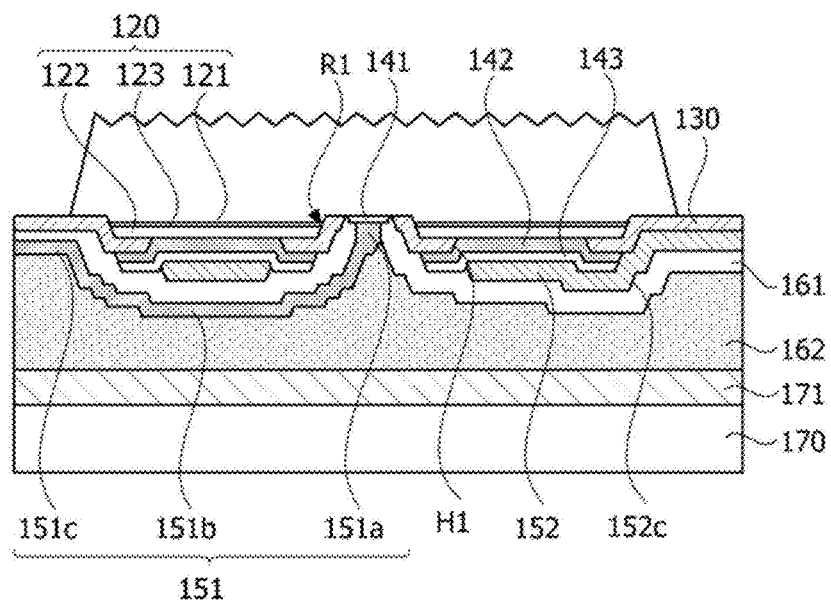
[Fig. 20l]
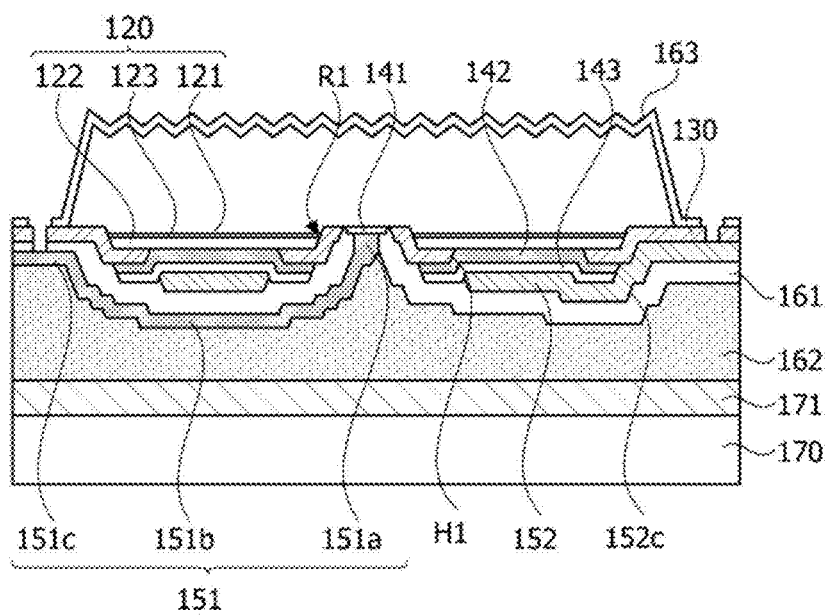

[Fig. 20m]
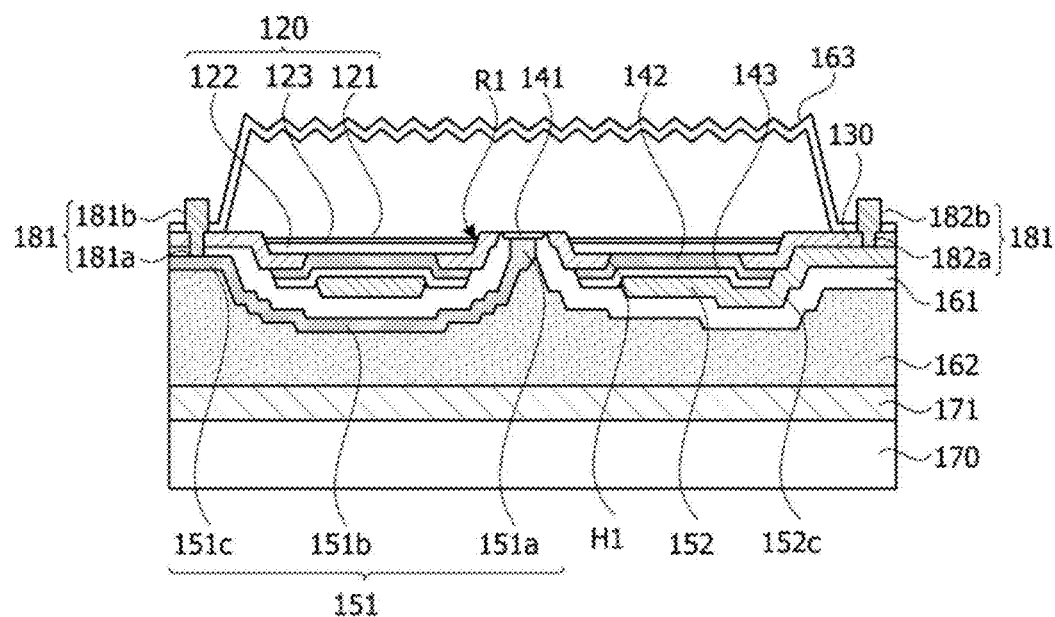
[Fig. 21a]
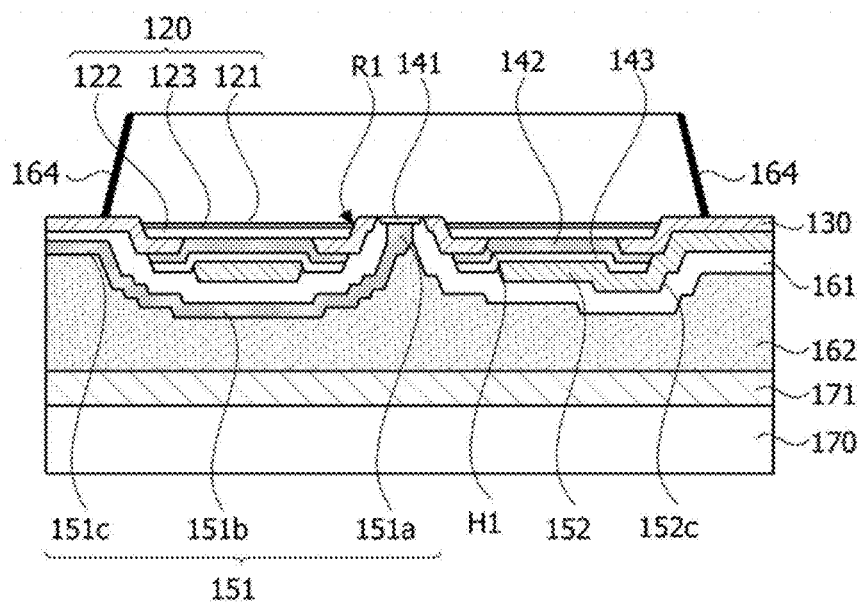

[Fig. 21b]
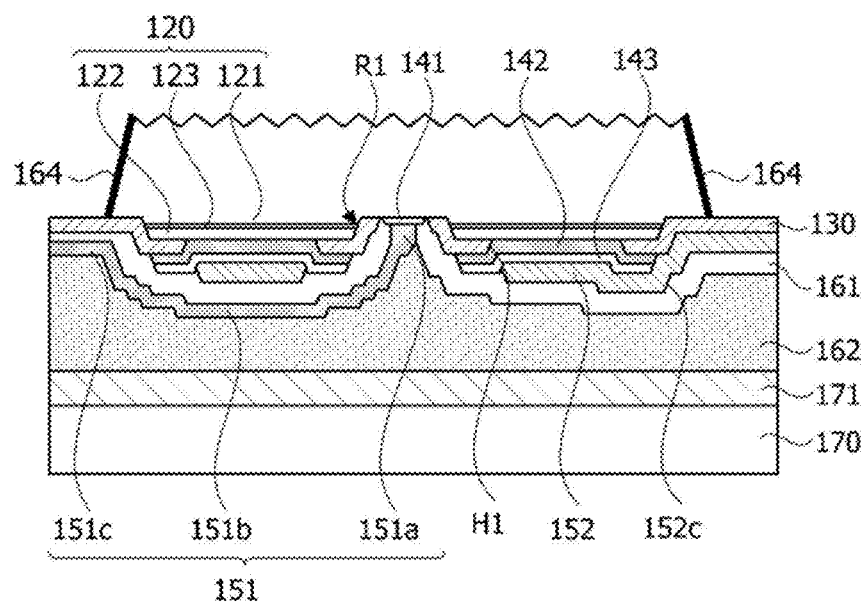
[Fig. 21c]
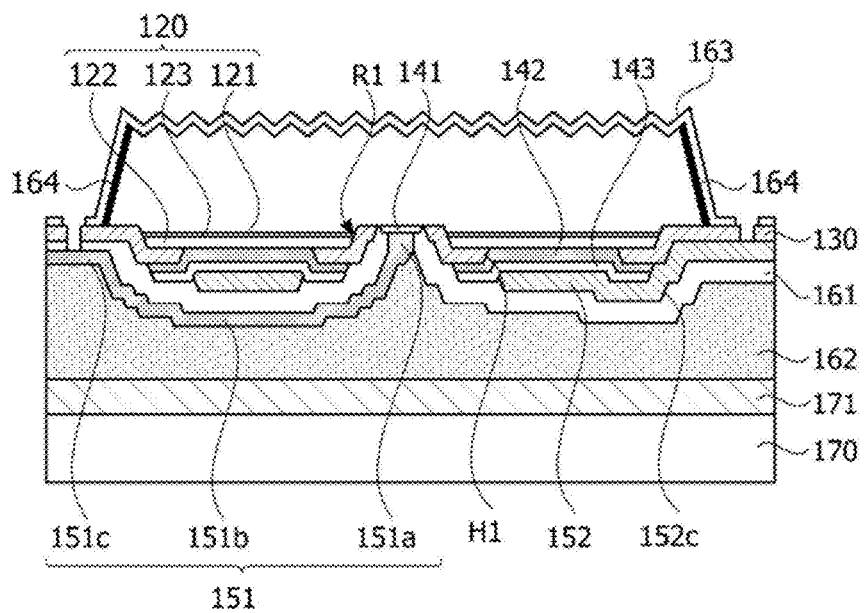

[Fig. 21d]
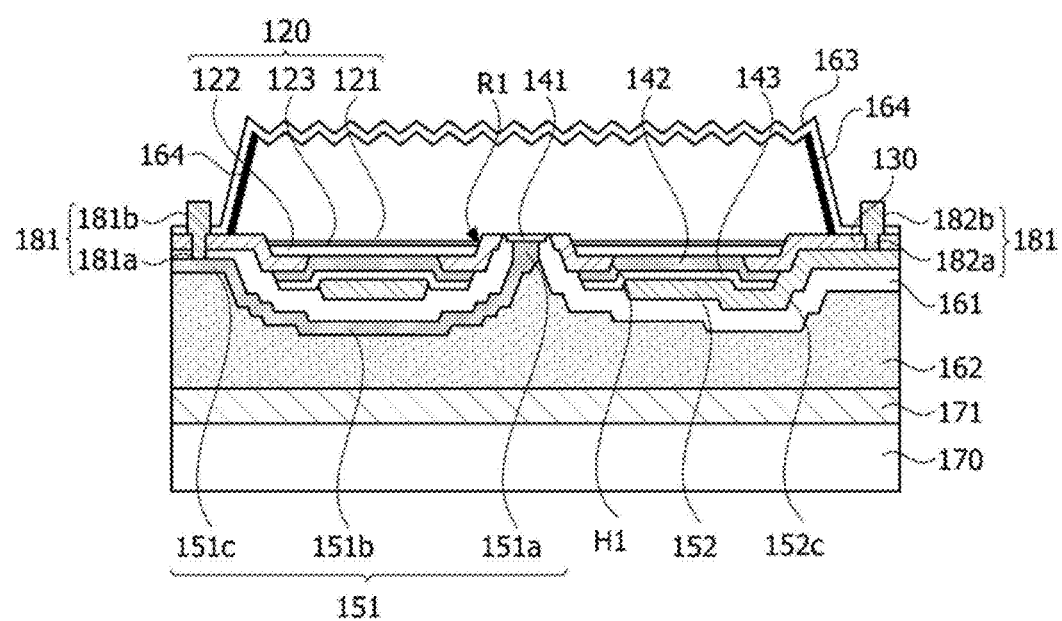

SEMICONDUCTOR DEVICE PACKAGE

CROSS-REFERENCE TO RELATED PATENT APPLICATIONS

This application is a Continuation of copending application Ser. No. 16/979,734, filed on Sep. 10, 2020, which is a U.S. National Stage Application under 35 U.S.C. § 371 of PCT Application No. PCT/KR2019/004032, filed on Apr. 5, 2019, which claims priority to the Korean Application Nos. 10-2018-0039893 and 10-2018-0049083, filed on Apr. 5, 2018 and Apr. 27, 2018, respectively, all of which are hereby expressly incorporated by reference into the present application.

TECHNICAL FIELD

The present invention relates to a semiconductor device package.

BACKGROUND ART

Semiconductor devices including compounds such as GaN and AlGaN may be variously used as light-emitting devices, light-receiving devices, and various diodes due to many advantages thereof, such as wide and easily adjustable bandgap energy.

In particular, light-emitting devices, such as light-emitting diodes and laser diodes, which use a III-V group or II-VI group compound semiconductor material, are capable of rendering various colors, such as red, green, and blue, and ultraviolet rays by virtue of the development of thin-film growth technologies and device materials, are capable of producing white light at high efficiency using fluorescent materials or through color mixing, and have advantages such as low power consumption, semi-permanent lifespan, fast response speed, safety, and environmental friendliness as compared with conventional light sources such as fluorescent lamps and incandescent lamps.

In addition, when a light-receiving device such as a photodetector or a solar cell is manufactured using a III-V group or II-VI group compound semiconductor material, due to the development of an element material, the light-receiving device generates a photocurrent by absorbing light in various wavelength regions so that light in various wavelength regions from a gamma ray region to a radio wavelength region can be used. In addition, since the light-receiving device has advantages of having fast response speed, safety, environmental friendliness, and easy control of an element material, the light-receiving device can also be easily used for power control, microwave circuits, or communication modules.

Accordingly, application of the semiconductor device has expanded to being applied as a transmission module of an optical communication device, a light-emitting diode (LED) backlight capable of replacing a cold cathode fluorescent lamp (CCFL) which constitutes a backlight of a liquid crystal display (LCD) device; a white LED lighting device capable of replacing a fluorescent lamp or an incandescent lamp; a headlight for a vehicle; a traffic light; a sensor for sensing gas or fire; and the like. In addition, the application of the semiconductor device may be expanded to a high frequency application circuit, another power control device, and a communication module.

A plurality of light-emitting devices (chips) may be formed into a package and used as the headlight for a vehicle. In particular, recently, there is a rising interest in headlights in which a plurality of chips can be independently turned on.

In this case, in order to make the plurality of chips appear as one light source, a distance between the chips should be minimized, but problems such as optical interference may occur. In addition, since a plurality of small-sized chips are disposed, there is a problem in that improving a contrast ratio is difficult when on/off-control is performed for each chip.

SUMMARY OF THE INVENTION

The present invention is directed to providing a semiconductor device package having an improved contrast ratio.

The present invention is also directed to providing a semiconductor device package having improved current spreading.

Problems to be solved in embodiments are not limited thereto, and objects and effects which may be determined from solutions to the problems and embodiments described below are also included.

According to an embodiment of the present invention, a semiconductor device package includes a substrate, and a plurality of semiconductor structures disposed to be spaced apart from each other at a central portion of the substrate, wherein the semiconductor structure is disposed on the substrate and includes a first conductivity-type semiconductor layer, a second conductivity-type semiconductor layer, and an active layer disposed between the first conductivity-type semiconductor layer and the second conductivity-type semiconductor layer, and a length ratio of a maximum height of an outermost surface of the first conductivity-type semiconductor layer to a separation distance between the adjacent semiconductor structures is in a range of 1:3 to 1:60.

The semiconductor structure may further include a channel layer at an edge thereof.

A side surface of the second conductivity-type semiconductor layer, a side surface of the active layer, and a lower surface of the first conductivity-type semiconductor layer may be exposed at the channel layer.

The maximum height of the outermost surface of the first conductivity-type semiconductor layer may be different from a height from an upper surface of the first conductivity-type semiconductor layer to an upper surface of the active layer.

An upper surface of the first conductivity-type semiconductor layer may include a first surface, a second surface disposed below the first surface, and an inclined surface positioned between the first surface and the second surface, and a height from a lower surface of the first conductivity-type semiconductor layer to the first surface may be greater than a height from the lower surface of the first conductivity-type semiconductor layer to the second surface.

The semiconductor device package may further include a plurality of first interconnection lines disposed between the substrate and the plurality of semiconductor structures and electrically connected to the first conductivity-type semiconductor layer, a plurality of second interconnection lines disposed between the substrate and the plurality of semiconductor structures and electrically connected to the second conductivity-type semiconductor layer, a first insulating layer disposed between the first interconnection line and the second interconnection line, a plurality of first pads each electrically connected to the first interconnection line, and a plurality of second pads each electrically connected to the second interconnection line.

The first interconnection line may include a first through-portion, which passes through the active layer, the second conductivity-type semiconductor layer, and the first insulating layer and is electrically connected to the first conductivity-type semiconductor layer, and a first end portion which extends to an edge of the substrate.

The second interconnection line may include a second end portion extending to the edge of the substrate.

The plurality of first pads and the plurality of second pads may be disposed along an edge of the substrate.20

The plurality of semiconductor structures may be disposed in a central portion of the plurality of first pads and the plurality of second pads.

The semiconductor device package may further include a channel layer disposed between the substrate and the semiconductor structure to expose portions of the first conductivity-type semiconductor layer and the second conductivity-type semiconductor layer.

The first electrode may be disposed on the first conductivity-type semiconductor layer exposed by the channel layer; and the second electrode may be disposed on the second conductivity-type semiconductor layer exposed by the channel layer.

According to an embodiment of the present invention, a display apparatus includes a semiconductor device package which includes a substrate, a plurality of semiconductor structures disposed to be spaced apart from each other at a central region of the substrate, a plurality of first interconnection lines disposed between the substrate and the plurality of semiconductor structures and electrically connected to a first conductivity-type semiconductor layer, and a plurality of second interconnection lines disposed between the substrate and the plurality of semiconductor structures and electrically connected to a second conductivity-type semiconductor layer, a plurality of data lines connected to the plurality of first interconnection lines, a plurality of scan lines connected to the plurality of second interconnection lines, a first driving unit connected to the plurality of data lines to provide a first control signal, a second driving unit connected to the plurality of scan lines to provide a second control signal, and a controller configured to determine the number of time divisions according to input data to provide the first control signal and the second control signal to the first driving unit and the second driving unit, wherein the semiconductor structure is disposed on the substrate and includes the first conductivity-type semiconductor layer, the second conductivity-type semiconductor layer, and an active layer disposed between the first conductivity-type semiconductor layer and the second conductivity-type semiconductor layer.

A length ratio of a maximum height of an outermost surface of the first conductivity-type semiconductor layer to a separation distance between the adjacent semiconductor structures may be in a range of 1:3 to 1:60.

According to an embodiment of the present invention, a semiconductor device package includes a substrate and a plurality of semiconductor structures disposed in a matrix form to be spaced apart from each other on the substrate, wherein the semiconductor structure is disposed on the substrate and includes a first conductivity-type semiconductor layer, a second conductivity-type semiconductor layer, and an active layer disposed between the first conductivity-type semiconductor layer and the second conductivity-type semiconductor layer, and wherein the semiconductor device package further includes an intermediate layer disposed on an outermost surface of the first conductivity-type semiconductor layer, and the intermediate layer overlaps the outermost surface of the first conductivity-type semiconductor layer in a direction perpendicular to a thickness direction thereof.

The semiconductor structure may further include a channel layer at an edge thereof.

A side surface of the second conductivity-type semiconductor layer, a side surface of the active layer, and a lower surface of the first conductivity-type semiconductor layer may be exposed at the channel layer.

The outermost surface of the first conductivity-type semiconductor layer may be disposed between the lower surface of the first conductivity-type semiconductor layer and an upper surface of the first conductivity-type semiconductor layer.

The intermediate layer may extend from the outermost surface of the first conductivity-type semiconductor layer to the upper surface of the first conductivity-type semiconductor layer.

The semiconductor device package may further include a passivation layer disposed on the semiconductor structure.

The intermediate layer may be disposed in at least one of a position between the passivation layer and an outer surface of the first conductivity-type semiconductor layer, a position inside the passivation layer, and a position on the passivation layer.

The semiconductor device package may further include a plurality of first interconnection lines disposed between the substrate and the plurality of semiconductor structures and electrically connected to the first conductivity-type semiconductor layer, a plurality of second interconnection lines disposed between the substrate and the plurality of semiconductor structures and electrically connected to the second conductivity-type semiconductor layer, a first insulating layer disposed between the first interconnection line and the second interconnection line, a plurality of first pads each electrically connected to the first interconnection line, and a plurality of second pads each electrically connected to the second interconnection line.

The first interconnection line may include a first through-portion, which passes through the active layer, the second conductivity-type semiconductor layer, and the first insulating layer and is electrically connected to the first conductivity-type semiconductor layer, and a first end portion which extends to an edge of the substrate.

The second interconnection line may include a second end portion extending to the edge of the substrate.

The plurality of first pads and the plurality of second pads may be disposed along the edge of the substrate.

The plurality of semiconductor structures may be disposed in a central portion of the plurality of first pads and the plurality of second pads.

According to an embodiment of the present invention, a display apparatus includes a semiconductor device package which includes a substrate, a plurality of semiconductor structures disposed in a matrix form on the substrate, a plurality of first interconnection lines disposed between the substrate and the plurality of semiconductor structures and electrically connected to a first conductivity-type semiconductor layer, and a plurality of second interconnection lines disposed between the substrate and the plurality of semiconductor structures and electrically connected to a second conductivity-type semiconductor layer, a plurality of data lines connected to the plurality of first interconnection lines, a plurality of scan lines connected to the plurality of second interconnection lines, a first driving unit connected to the plurality of data lines to provide a first control signal, a second driving unit connected to the plurality of scan lines to provide a second control signal, and a controller configured to determine the number of time divisions according to input data to provide the first control signal and the second control signal to the first driving unit and the second driving unit, wherein the semiconductor structure is disposed on the substrate and includes the first conductivity-type semiconductor layer, the second conductivity-type semiconductor layer, and an active layer disposed between the first conductivity-type semiconductor layer and the second conductivity-type semiconductor layer, the semiconductor device package further includes an intermediate layer disposed on an outermost surface of the first conductivity-type semiconductor layer, and the intermediate layer overlaps the outermost surface of the first conductivity-type semiconductor layer in a direction perpendicular to a thickness direction thereof.

Advantageous Effects

According to embodiments, it is possible to implement a semiconductor device package having an improved contrast ratio.

In addition, it is possible to manufacture a semiconductor device package having improved current spreading.

The various and advantageous advantages and effects of the present invention are not limited to the above description and may be more easily understood in the course of describing specific embodiments of the present invention.

BRIEF DESCRIPTION OF THE DRAWINGS

FIG. 4 is an enlarged view of region K in FIG. 3.

FIG. 5 is an enlarged view of region L in FIG. 3.

FIG. 6 is a graph showing a contrast ratio according to a maximum height of a side surface of a semiconductor structure.

FIG. 7 is a graph showing a contrast ratio according to a separation distance between adjacent semiconductor structures.

FIG. 8 is a view illustrating a first interconnection line in FIG. 2.

FIG. 9 is a view illustrating a second interconnection line in FIG. 2.

FIG. 10 is a cross-sectional view of a semiconductor device package according to a second embodiment.

FIG. 11 is a cross-sectional view of a semiconductor device package according to a third embodiment.

FIG. 13 is an enlarged view of region N in FIG. 12.

FIG. 14 is an enlarged view of region O in FIG. 12.

FIG. 15 is a graph showing a contrast ratio according to an intermediate layer.

FIG. 16 is a cross-sectional view of a semiconductor device package according to a fourth embodiment.

FIG. 17 is a cross-sectional view of a semiconductor device package according to a fifth embodiment.

FIGS. 18A to 18C are modified examples of FIG. 11.

FIG. 19 is a conceptual view illustrating a display apparatus according to an embodiment.

FIGS. 20A to 20M are views illustrating a method of manufacturing the semiconductor device package according to the first embodiment.

FIGS. 21A to 21D are views illustrating a method of manufacturing the semiconductor device package according to the third embodiment.

DETAILED DESCRIPTION OF THE EMBODIMENTS

Figure 1:
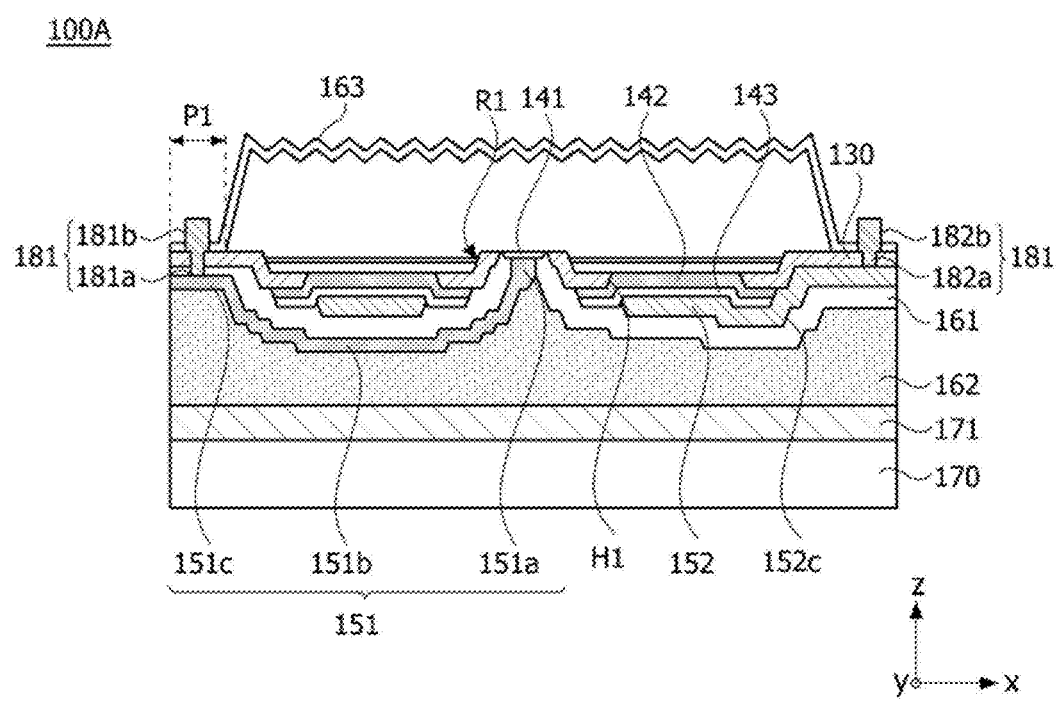
FIG. 1 is a cross-sectional view of a semiconductor device package according to a first embodiment.

While the present invention is open to various modifications and alternative embodiments, specific embodiments thereof will be described and shown by way of example in the accompanying drawings. However, it should be understood that there is no intention to limit the present invention to the particular embodiments disclosed, and, on the contrary, the present invention is to cover all modifications, equivalents, and alternatives falling within the spirit and scope of the present invention.

It should be understood that, although the terms including ordinal numbers such as first, second, and the like may be used herein to describe various elements, the elements are not limited by the terms. The terms are used only for the purpose of distinguishing one element from another. For example, without departing from the scope of the present invention, a second element could be termed a first element, and similarly a first element could be also termed a second element. The term "and/or" includes any one or all combinations of a plurality of associated listed items.

In the case that one component is mentioned as being "connected" or "linked" to another component, it may be connected or linked to the corresponding component directly or other components may be present therebetween. On the other hand, in the case that one component is mentioned as being "directly connected" or "directly linked" to another component, it should be understood that other components are not present therebetween.

It is to be understood that terms used herein are for the purpose of the description of particular embodiments and not for limitation. A singular expression includes a plural expression unless the context clearly indicates otherwise. It will be further understood that the terms "comprises" and/or "comprising," when used in this specification, specify the presence of stated features, integers, steps, operations, elements, components, and/or groups thereof but do not preclude the presence or addition of one or more other features, integers, steps, operations, elements, components, and/or groups thereof.

Unless defined otherwise, all the terms (including technical and scientific terms) used herein have the same meaning as commonly understood by one of ordinary skill in the art to which the present invention belongs. It will be further understood that the terms, such as those defined in commonly used dictionaries, should be interpreted as having meanings that are consistent with their meanings in the context of the relevant art and should not be interpreted in an idealized or overly formal sense unless expressly defined otherwise herein.

Hereinafter, embodiments will be described in detail with reference to the accompanying drawings, the same or corresponding elements will be given the same reference numbers regardless of drawing symbols, and redundant descriptions will be omitted.

A semiconductor device according to the present embodiment may be a light-emitting device.

In the semiconductor device, electrons and holes recombine to emit light, and a wavelength of the light may be determined by an energy band gap inherent to a material. The emitted light may vary depending on a composition of the material.

Hereinafter, embodiments of the present invention will be described in more detail with reference to the accompanying drawings so as to be easily realized by those skilled in the art.

A semiconductor device according to the present embodiment may be a light-emitting device.

In the semiconductor device, electrons and holes recombine to emit light, and a wavelength of the light may be determined by an energy band gap inherent to a material. The emitted light may vary depending on a composition of the material.

Hereinafter, embodiments of the present invention will be described in more detail with reference to the accompanying drawings so as to be easily realized by those skilled in the art.

FIG. 1 is a cross-sectional view of a semiconductor device package according to a first embodiment.

Referring to FIG. 1, a semiconductor device package 100A according to the first embodiment may include a substrate 170 and a plurality of semiconductor structures 120 disposed to be spaced apart from each other.

The semiconductor device package 100A may further include a bonding layer 171, a channel layer 130, a first electrode 141, a second electrode 142, a reflective layer 143, a first interconnection line 151, a second interconnection line 152, a first insulating layer 161, a second insulating layer 162, a passivation layer 163, a first pad 181, and a second pad 182.

Figure 2:
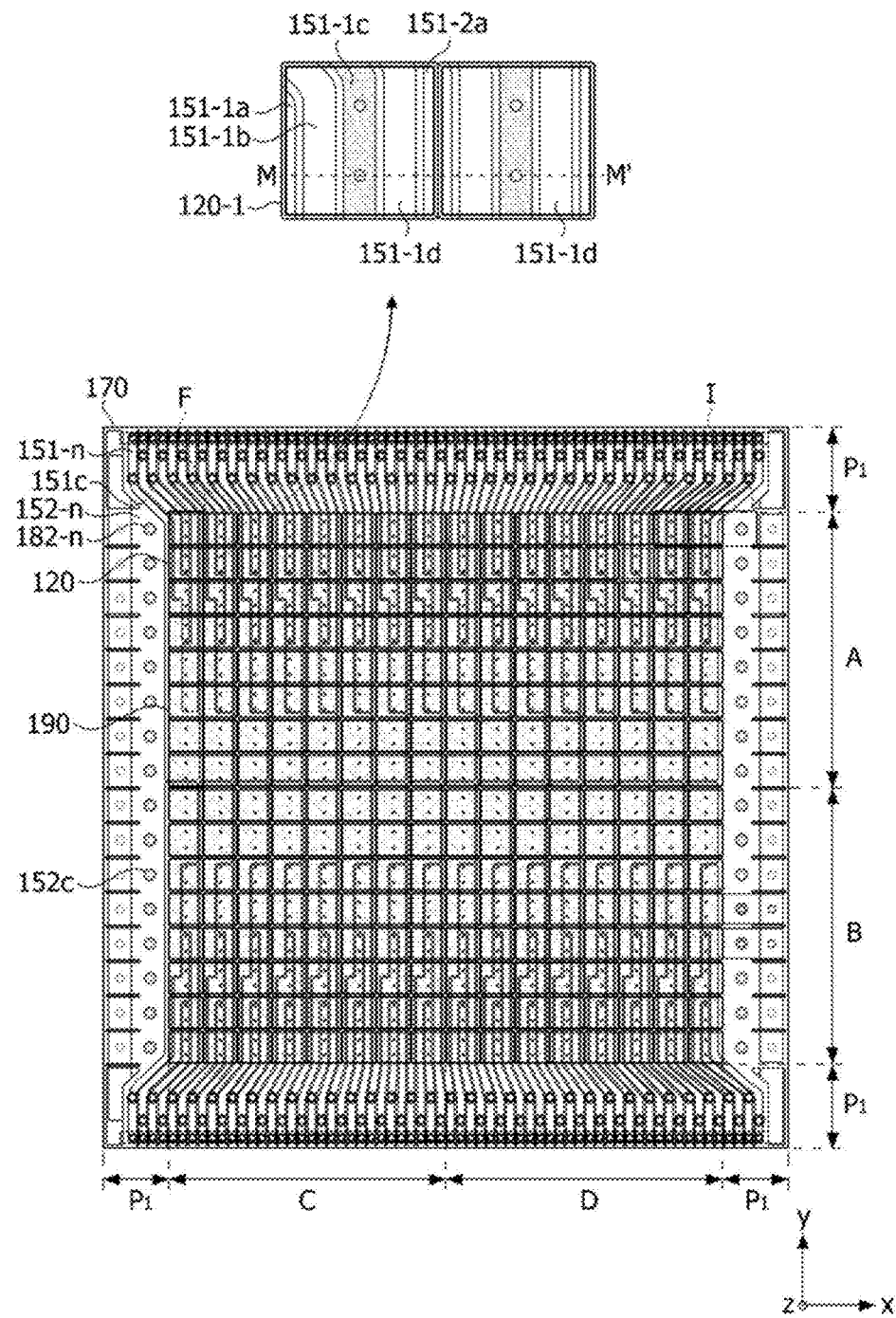
FIG. 2 is a plan view of the semiconductor device package according to the first embodiment.

Here, it will be described below that FIG. 1 illustrates one semiconductor structure 120 disposed between the first pad 181 and the second pad 182 for convenience of description. However, as shown in FIG. 2, substantially, a plurality of semiconductor structures 120 (see FIG. 1) may be disposed to be spaced apart from each other by a predetermined distance on the substrate 170, and the first pad 181 and the second pad 182 may be disposed to surround an edge of the substrate 170.

First, the semiconductor structure 120 may be disposed on the substrate 170. The substrate 170 may serve to support the semiconductor structure 120. The substrate 170 may include a material having a heat dissipation property. Therefore, a heat dissipation property may be improved through the substrate 170. For example, the substrate 170 may include ceramic, but the present invention is not limited thereto. In particular, since a manufacturing process, package mounting, and heat dissipating of the semiconductor device package 100A are easily performed due to the substrate 170, reliability of an apparatus can be improved. However, the present invention is not necessarily limited thereto, and the substrate 170 may be a metal substrate made of various materials.

The semiconductor structure 120 may be disposed on the substrate 170. The semiconductor structure 120 may include a first conductivity-type semiconductor layer 121, a second conductivity-type semiconductor layer 122, and an active layer 123 disposed between the first conductivity-type semiconductor layer 121 and the second conductivity-type semiconductor layer 122. In the drawing, the first conductivity-type semiconductor layer 121 is illustrated as facing upward and the second conductivity-type semiconductor layer 122 is illustrated as facing the substrate 170, but the present invention is not limited thereto.

The first conductivity-type semiconductor layer 121 may be implemented using at least one selected from among a III-V group compound semiconductor, a II-VI group compound semiconductor, and the like. The first conductivity-type semiconductor layer 121 may be made of a semiconductor material having an empirical formula of $In_xAl_yGa_{1-x-y}N$ ($0 \leq x \leq 1$, $0 \leq y \leq 1$, and $0 \leq x+y \leq 1$) or may be made of a material selected from among AlInN, AlGaAs, GaP, GaAs, GaAsP, and AlGaInP. The first conductivity-type semiconductor layer 121 may be doped with a first dopant. The first dopant may be an n-type dopant such as silicon (Si), germanium (Ge), tin (Sn), selenium (Se), or tellurium (Te). That is, the first conductivity-type semiconductor layer 121 may be an n-type semiconductor layer doped with an n-type dopant.

Meanwhile, an uneven structure may be formed on the first conductivity-type semiconductor layer 121. The uneven structure can improve light extraction efficiency of the semiconductor structure 120.

The second conductivity-type semiconductor layer 122 may be implemented using at least one selected from among a III-V group compound semiconductor, a II-VI group compound semiconductor, and the like. The second conductivity-type semiconductor layer 122 may be made of a semiconductor material having an empirical formula of $In_xAl_yGa_{1-x-y}N$ ($0 \leq x \leq 1$, $0 \leq y \leq 1$, and $0 \leq x+y \leq 1$) or may be made of a material selected from among AlInN, AlGaAs, GaP, GaAs, GaAsP, and AlGaInP. The second conductivity-type semiconductor layer 122 may be doped with a second dopant. The second dopant may be a p-type dopant such as magnesium (Mg), zinc (Zn), calcium (Ca), strontium (Sr), or barium (Ba). That is, the second conductivity-type semiconductor layer 122 may be a p-type semiconductor layer doped with a p-type dopant.

The active layer 123 may be disposed between the first conductivity-type semiconductor layer 121 and the second conductivity-type semiconductor layer 122. The active layer 123 is a layer in which electrons (or holes) injected through the first conductivity-type semiconductor layer 121 meet holes (or electrons) injected through the second conductivity-type semiconductor layer 122. As electrons and holes are recombined to transition to a low energy level, the active layer 123 may generate light having a wavelength corresponding thereto.

The active layer 123 may have any one of a single well structure, a multi well structure, a single quantum well structure, a multi quantum well (MQW) structure, a quantum dot structure, and a quantum line structure, but the present invention is not limited thereto. When the active layer 123 is formed in a well structure, a well layer/barrier layer of the active layer 123 may be formed to include at least one pair structure selected from among InGaN/GaN, InGaN/InGaN, GaN/AlGaN, InAlGaN/GaN, GaAs(In-GaAs)/AlGaAs, and GaP(InGaP)/AlGaP, but the present invention is not limited thereto. The well layer may include a material having a narrower band gap than the barrier layer.

The bonding layer 171 may bond the substrate 170 and the semiconductor structure 120. In other words, the semiconductor structure 120 and structures positioned below the semiconductor structure 120 may be disposed on the substrate 170 by the bonding layer 171. The bonding layer 171 may be made of at least one selected from among AuSn, NiSn, AuIn, CuSn, $SiO_2$, and a resin, but the present invention is not limited thereto. For example, the bonding layer 171 may include a barrier metal or a bonding metal and may include, for example, at least one selected from among titanium (Ti), gold (Au), tin (Sn), nickel (Ni), chromium (Cr), gallium (Ga), indium (In), bismuth (Bi), copper (Cu), silver (Ag), and tantalum (Ta).

Meanwhile, the semiconductor structure 120 may include a first recess R1 having a predetermined depth. Specifically, the first recess R1 may be formed through mesa etching so as to pass through the second conductivity-type semiconductor layer 122 and the active layer 123 and extend to a partial region of the first conductivity-type semiconductor layer 121. Accordingly, a portion of the first conductivity-type semiconductor layer 121 may be exposed. Therefore, the first electrode 141 and the first interconnection line 151 may be electrically connected to the first conductivity-type semiconductor layer 121 through the first recess R1.

The channel layer 130 may be disposed in a partial region of a lower portion of the semiconductor structure 120. In addition, the channel layer 130 may be disposed to surround an edge of a lower portion of each semiconductor structure 120. The channel layer 130 may be partially disposed below the first recess R1. In addition, the channel layer 130 may be disposed between the substrate 170 and the semiconductor structure 120.

Specifically, the channel layer 130 may cover the first recess R1, and a side surface of the active layer 123, a portion of the first conductivity-type semiconductor layer 121, and a portion of the second conductivity-type semiconductor layer 122, which are exposed by the first recess R1.

The channel layer 130 may be disposed such that a side surface of the first conductivity-type semiconductor layer 121 is exposed in the first recess R1. That is, the channel layer 130 may be disposed to be in contact with the side surface of the first conductivity-type semiconductor layer 121, and a lower surface of the first conductivity-type semiconductor layer 121 may be exposed. Similarly, the channel layer 130 may be disposed such that a portion of the second conductivity-type semiconductor layer 122 is exposed. For example, a side surface of the second conductivity-type semiconductor layer 122 may be exposed. In addition, the channel layer 130 may be disposed between adjacent semiconductor structures 120, between the first pads 181 connected to the semiconductor structures 120, and between the second pads 182 connected to the semiconductor structures 120. Thus, the channel layer 130 may cover a portion of the second conductivity-type semiconductor layer 122. For example, the channel layer 130 may expose a portion of the second conductivity-type semiconductor layer 122 through a first hole H1.

The channel layer 130 may be made of an insulating material. Specifically, the channel layer 130 may be made of a non-conductive oxide or nitride. For example, the channel layer 130 may be formed as one selected from among a silicon oxide ($SiO_2$) layer, a silicon nitride ($Si_3N_4$) layer, a titanium oxide ($TiO_x$), and an aluminum oxide ($Al_2O_3$) layer, but the present invention is not limited thereto.

The channel layer 130 may allow the semiconductor structure 120 to be electrically connected only through the first interconnection line 151 and the second interconnection line 152 and provide structural insulation between adjacent semiconductor structures 120. In addition, the channel layer 130 may protect the second electrode 142, the first insulating layer 161, the second insulating layer 162, the bonding layer 171, and the substrate 170, which are disposed below the channel layer 130 and the semiconductor structure 120, from external contaminants or the like. As a result, a supporting force for the semiconductor structure 120 can be improved, and thus, the channel layer 130 can protect the semiconductor structure 120 from damage that may occur in a manufacturing process.

The first electrode 141 may be disposed in the first recess R1 so as to be electrically connected to the first conductivity-type semiconductor layer 121. The second electrode 142 may be disposed below the second conductivity-type semiconductor layer 122 to be electrically connected to the second conductivity-type semiconductor layer 122.

Specifically, the first electrode 141 may be disposed in the first recess R1. The first electrode 141 may be disposed in a region exposed by the channel layer 130 in the first recess R1.

The second electrode 142 may be disposed on the second conductivity-type semiconductor layer 122 exposed by the channel layer 130 in the first hole H1.

The first electrode 141 and the second electrode 142 may be made of a material having electrical conductivity. In addition, the first electrode 141 and the second electrode 142 may be made of a material having high reflectivity. For example, the first electrode 141 and the second electrode 142 may be made of at least one selected from among Ti, ruthenium (Ru), rhodium (Rh), iridium (Ir), Mg, Zn, aluminum (Al), indium (In), Ta, palladium (Pd), cobalt (Co), Ni, Si, germanium (Ge), Ag, platinum (Pt), and Au, or an alloy thereof. Furthermore, the first electrode 141 and the second electrode 142 may be ohmic electrodes and may be made, for example, of at least one selected from among indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO nitride (IZON), Al—Ga ZnO (AGZO), In—Ga ZnO (IGZO), ZnO, $IrO_x$, $RuO_x$, NiO, $RuO_x$/ITO, Ni/$IrO_x$/Au, and Ni/$IrO_x$/Au/ITO, but the present invention is not limited to such materials. In this case, light generated from the semiconductor structure 120 may be reflected from the first electrode 141 and the second electrode 142 and emitted upward. As a result, light extraction efficiency of the semiconductor structure can be improved. However, the present invention is not necessarily limited to such materials.

In addition, various materials for an ohmic contact may be included in the first electrode 141 and the second electrode 142.

The reflective layer 143 may be disposed below the second electrode 142. The reflective layer 143 may be made of a material having electrical conductivity. In addition, the reflective layer 143 may be made of a metal material having high reflectivity. The reflective layer 143 may be made of a metal or an alloy including at least one selected from among Ag, Ni, Al, Rh, Pd, Ir, Ru, Mg, Zn, Pt, Cu, Au, and hafnium (Hf). In addition, the reflective layer 143 may be made of the metal or alloy. For example, the reflective layer 143 may include at least one selected from among Ag, Al, a Ag—Pd—Cu alloy, and a Ag—Cu alloy, but the present invention is not limited to such materials.

The first insulating layer 161 may protect components of the semiconductor device package 100A and may electrically insulate adjacent components from each other. In addition, as the first insulating layer 161, an insulating layer having high transmittance may be used. For example, the first insulating layer 161 may be made of at least one selected from among $SiO_2$, $Si_xO_y$, $Si_3N_4$, $Si_xN_y$, $SiO_xN_y$, $TiO_2$, $ZrO_2$, $Si_3N_4$, $Al_2O_3$, AlN, and $MgF_2$, but the present invention is not limited to such materials.

In addition, the first insulating layer 161 may have a distributed Bragg reflector (DBR) structure. For example, the first insulating layer 161 may reflect light having a predetermined wavelength band, and rather than a single DBR, a multi-DBR may be applied to increase reflectance and improve luminous flux. In addition, the first insulating layer 161 may include a plurality of layers having different refractive indices.

The first insulating layer 161 may cover a portion of the first electrode 141 to expose a partial region of the first electrode 141. The first insulating layer 161 may be disposed below the second electrode 142, the channel layer 130, and the second interconnection line 152 to cover the second electrode 142 and the channel layer 130. Due to such a configuration, the first insulating layer 161 may provide electrical insulation between the first interconnection line 151 and the second interconnection line 152.

The second insulating layer 162 may be disposed below the first insulating layer 161 and the first interconnection line 151. The second insulating layer 162 may cover the first interconnection line 151 and the first insulating layer 161. Due to such a configuration, the second insulating layer 162 may electrically insulate the first interconnection line 151 from the outside and protect the first interconnection line 151 from contaminants. As a result, the second insulating layer 162 can improve reliability of the semiconductor device package.

The passivation layer 163 may be disposed on an upper portion of the semiconductor device package. That is, the passivation layer 163 may be disposed on the semiconductor structure 120 and, specifically, the first conductivity-type semiconductor layer 121. In addition, when the first conductivity-type semiconductor layer 121 has an uneven structure, the passivation layer 163 disposed on the first conductivity-type semiconductor layer 121 may have an uneven structure like the first conductivity-type semiconductor layer 121. However, the present invention is not limited thereto, and as will be described below, the passivation layer 163 may be partially disposed on the semiconductor structure 120.

The passivation layer 163 may be disposed on an upper surface of the semiconductor device package 100A, but the present invention is not limited thereto. For example, a portion of the first pad 181 and a portion of the second pad 182 may be disposed at a higher level than the passivation layer 163 through a second-first hole H2-1 and a second-second hole H2-2, respectively.

The first interconnection line 151 may be electrically connected to the first electrode 141. The second interconnection line 152 may be electrically connected to the second electrode 142.

The first interconnection line 151 may be electrically connected to the first electrode 141 and may extend to one side of the semiconductor structure 120 to be connected to the first pad 181.

In addition, the second interconnection line 152 may be electrically connected to the second electrode 142 and may extend to the other side of the semiconductor structure 120 to be electrically connected to the second pad 182.

The first interconnection line 151 and the second interconnection line 152 may extend in different directions on the substrate 170. For example, extending directions of the first interconnection line 151 and the second interconnection line 152 may be perpendicular to each other. This will be described in detail below with reference to FIG. 2.

Specifically, the second interconnection line 152 may be disposed between the semiconductor structure 120 and the substrate 170. In addition, the second interconnection line 152 may be disposed on the second electrode 142 and electrically connected to the second electrode 142. The second interconnection line 152 may extend from the second electrode 142 in a direction toward an outer side surface of the semiconductor structure 120. For example, the second interconnection line 152 may include a second end portion 152c that extends to protrude further than the outer side surface of the semiconductor structure 120. In other words, one end portion of the second interconnection line 152 may be connected to the second electrode 142. The second end portion 152c of the second interconnection line 152 may extend from one end portion of the second interconnection line 152 toward the edge of the substrate 170. Accordingly, the second end portion 152c may be electrically connected to the second pad 182 which will be described below. In this case, the second end portion 152c may be disposed to protrude further than the side surface of the semiconductor structure 120 below the semiconductor structure 120. Due to such a configuration, the second interconnection line 152 may be easily connected to the second pad 182 disposed at a side portion of the semiconductor structure 120.

That is, as shown in FIG. 2 below, the second end portion 152c of the second interconnection line 152 may be disposed to protrude further toward the edge of the substrate 170 than an edge of the semiconductor structure 120. That is, the edge of the semiconductor structure 120 may be etched, and thus, the semiconductor structure 120 may be disposed only at a central portion of the substrate (crossing region of regions A and B, regions C and D, and regions E and F). Accordingly, the semiconductor structure 120 may expose the second end portion 152c disposed at the edge of the substrate. The second pad 182 may pass through the channel layer 130 to be electrically connected to the second pad 182. Therefore, the second end portion 152c of the second interconnection line 152 and the second pad 182 may overlap each other in a thickness direction (z-axis direction) of the substrate 170 at the edge of the substrate 170.

The first interconnection line 151 may be disposed on the first electrode 141 between the semiconductor structure 120 and the substrate 170. In addition, the first interconnection line 151 may extend from the first electrode 141 in a direction toward the edge of the semiconductor structure 120.

The first interconnection line 151 may include a first through-portion 151a, a first connection portion 151b, and a first end portion 151c. The first interconnection line 151 may be spaced apart and insulated from the second interconnection line 152 by the first insulating layer 161.

The first through-portion 151a may pass through the active layer 123, the second conductivity-type semiconductor layer 122, and the first insulating layer 161. In addition, the first through-portion 151a may pass through a portion of the first conductivity-type semiconductor layer 121.

One end of the first through-portion 151a may be connected to the first electrode 141. The first through-portion 151a may extend from the first electrode 141 toward the substrate 170. The other end of the first through-portion 151a may be connected to one end of the first connection portion 151b.

The first connection portion 151b may extend from one end thereof toward the edge of the substrate 170 along one surface of the first insulating layer 161. The other end of the first connection portion 151b may be connected to one end of the first end portion 151c.

The first end portion 151c may protrude further than the outer side surface of the semiconductor structure 120. That is, the first end portion 151c may extend toward the edge of the substrate 170. Accordingly, a portion of the first end portion 151c may overlap an edge P1 of the substrate 170 in a thickness direction thereof. Therefore, the first interconnection line 151 may be easily connected to the first pad 181 disposed at the side portion of the semiconductor structure 120.

That is, as shown in FIG. 2 to be described below, the first end portion 151c of the first interconnection line 151 may be disposed to protrude further toward the edge of the substrate 170 than the edge of the semiconductor structure 120. Accordingly, the first end portion 151c of the first interconnection line 151, the channel layer 130, and the first pad 181 may overlap each other at the edge of the substrate 170 in a direction perpendicular to the substrate 170.

The first pad 181 and the second pad 182 may be disposed to be spaced apart from the semiconductor structure 120 on the substrate 170. Specifically, the first pad 181 and the second pad 182 may be disposed to surround the semiconductor structure 120 at the side portion of the semiconductor structure 120 or the edge of the substrate 170.

The first pad 181 may be electrically connected to the first conductivity-type semiconductor layer 121 through the first interconnection line 151 and the first electrode 141. The second pad 182 may be electrically connected to the second conductivity-type semiconductor layer 122 through the second interconnection line 152 and the second electrode 142.

The first pad 181 may include a first region 181a and a second region 181b.

First, one end of the first region 181a may be connected to the other end of the first end portion 151c. The first region 181a may pass through the first insulating layer 161, the channel layer 130, and the passivation layer 163.

The second region 181b may be disposed to protrude from the passivation layer 163. The first pad 181 may be disposed to be spaced apart from the semiconductor structure 120. In particular, the first pad 181 may be disposed to be spaced apart from the side surface of the semiconductor structure 120 and the passivation layer 163 covering the side surface, but the present invention is not limited thereto.

The second pad 182 may include a first region 182a and a second region 182b.

First, the first region 182a may pass through the channel layer 130 and the passivation layer 163. One end of the first region 181a may be connected to the other end of the second end portion 152c of the second interconnection line 152.

One end of the second region 182a may be connected to the other end of the second end portion 152c. The second region 182b may be disposed to protrude from the passivation layer 163. The second pad 182 may be disposed to be spaced apart from the semiconductor structure 120. In particular, the second pad 182 may be disposed to be spaced apart from the side surface of the semiconductor structure 120 and the passivation layer 163 covering the side surface.

Figure 3:
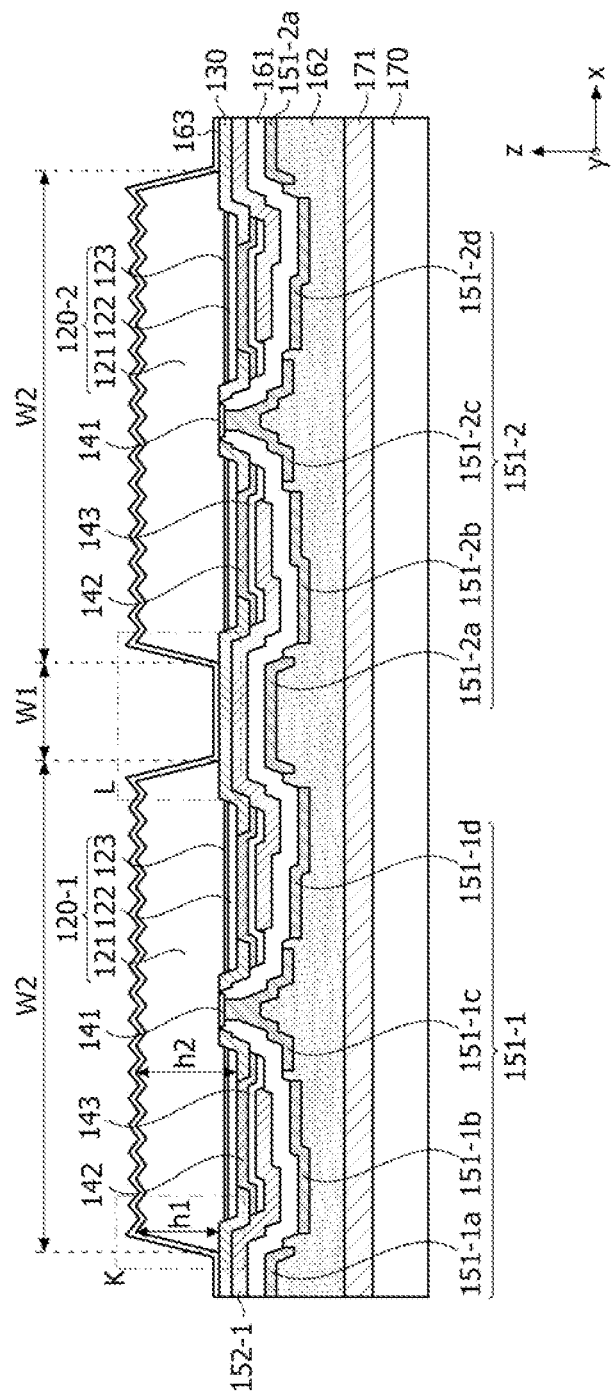
FIG. 3 is a cross-sectional view taken along line M-M' in FIG. 2.

FIG. 2 is a plan view of the semiconductor device package according to the first embodiment. FIG. 3 is a cross-sectional view taken along line M-M' in FIG. 2. FIG. 4 is an enlarged view of region K in FIG. 3. FIG. 5 is an enlarged view of region L in FIG. 3. FIG. 6 is a graph showing a contrast ratio according to a maximum height of the side surface of the semiconductor structure. FIG. 7 is a graph showing a contrast ratio according to a separation distance between adjacent semiconductor structures. FIG. 8 is a view illustrating the first interconnection line in FIG. 2. FIG. 9 is a view illustrating the second interconnection line in FIG. 2.

Referring to FIG. 2, the semiconductor device package 100A according to the first embodiment may include the plurality of semiconductor structures 120 disposed on one substrate 170.

Specifically, the semiconductor device package 100A may include the plurality of semiconductor structures 120 (see FIG. 1), a plurality of first interconnection lines 151-$n$, a plurality of second interconnection lines 152-$n$, a plurality of first pads 181-$n$, and a plurality of second pads 182-$n$ on the substrate 170.

In FIG. 1, it has been described that one semiconductor structure 120, one first interconnection line 151, one second interconnection line 152, one first pad 181, and one second pad 182 are illustrated for convenience of description.

Specifically, the plurality of first pads 181-$n$ and the plurality of second pads 182-$n$ may be disposed to be spaced apart from the plurality of semiconductor structures 120. The plurality of first pads 181-$n$ and the plurality of second pads 182-$n$ may be disposed at the edge of the substrate 170 to surround the plurality of semiconductor structures 120.

The first interconnection lines 151-$n$ may be disposed between the semiconductor structures 120 and the plurality of first pads 181-$n$ to electrically connect first conductivity-type semiconductor layers of the semiconductor structures 120 and the plurality of first pads 181-$n$.

Similarly, the second interconnection lines 152-$n$ may be disposed between the semiconductor structures 120 and the plurality of second pads 182-$n$ to electrically connect second conductivity-type semiconductor layers of the semiconductor structures 120 and the plurality of second pads 182-$n$.

The first pads 181-$n$ may be disposed at upper and lower portions of the edge of the substrate 170 to face each other. The second pads 182-$n$ may be disposed on left and right portions of the edge of the substrate 170 to face each other. However, in some cases, the position and arrangement structure of the first pads 181-$n$ and the second pads 182-$n$ may be changed.

First, the substrate 170 may be divided into central portions A, B, C, and D and the edge P1. For example, the central portions A, B, C, and D may be central regions of the substrate in which the semiconductor structures are disposed. In addition, the first interconnection lines 151-$n$ and the second interconnection lines 152-$n$ are disposed at the central portions A, B, C, and D and may be electrically connected to the plurality of semiconductor structures.

The edge P1 may be a region excluding the central portions A, B, C, and D, and the plurality of first pads 181-$n$ and the plurality of second pads 182-$n$ may be disposed thereat. In addition, the first interconnection lines 151-$n$ and the second interconnection lines 152-$n$ may be partially disposed at the edge P1.

Accordingly, the first interconnection line 151-$n$ and the second interconnection line 152-$n$ may be electrically connected to the first pad 181-$n$ and the second pad 182-$n$ at the edge P1, respectively and may include regions that overlap each other in a thickness direction thereof.

The plurality of semiconductor structures may be disposed to be spaced apart from each other by a predetermined distance at the central portion of the substrate 170 and may emit light. Here, 16 semiconductor structures 120 are illustrated as being disposed in each of horizontal and vertical directions, but the present invention is not limited thereto. Each semiconductor structure may have a size of 500 μm×500 μm or less. That is, each of a width and a length of the semiconductor structure may be 500 μm or less. For example, the size of the semiconductor structure may be 300 μm×300 μm, 250 μm×250 μm, or 110 μm×110 μm. More preferably, each of the width and the length of the individual semiconductor structure may be in a range of 70 μm to 80 μm. However, the present invention is not limited thereto.

In the plurality of semiconductor structures, lines 1 to 8 are defined as region A and lines 9 to 16 are defined as region B from the top of the substrate 170. In addition, in the plurality of semiconductor structures, lines 1 to 8 are defined as region C and lines 9 to 16 are defined as region D from the left of the substrate 170.

Specifically, referring to FIG. 3, as described above, the second end portion 152c may protrude further outward than an extension line of the side surface of the semiconductor structure 120. The second end portion 152c may be electrically connected to the second pad 182-n.

Meanwhile, the first interconnection lines 151-n and the second interconnection lines 152-n may be electrically connected to the plurality of semiconductor structures 120. Although only two semiconductor structures 120 are illustrated in the drawings, substantially, as shown in FIG. 2, the plurality of semiconductor structures 120 may be disposed.

A first connection portion 151b of the first interconnection line 151-n may be disposed along one surface of the first insulating layer 161 between the substrate 170 and the plurality of semiconductor structures 120. A first through-portion 151a may extend from each semiconductor structure 120 to electrically connect the plurality of semiconductor structures 120 and one first connection portion 151b.

Meanwhile, four first interconnection lines 151-n may be disposed below one semiconductor structure 120 disposed at an outermost side.

In addition, one second interconnection line 152-n may be disposed along one surfaces of the plurality of second electrodes 142 between the substrate 170 and the plurality of semiconductor structures 120.

First, referring to FIG. 2, the plurality of first interconnection lines 151-n (n≥1) may be disposed at the edge P1 of the substrate 170. In this case, one first-$n^{th}$ interconnection line 151-n may be electrically connected to eight semiconductor structures 120. Accordingly, 64 first interconnection lines 151-n may be disposed on each of upper and lower sides of the substrate 170. That is, four first-$n^{th}$ interconnection lines 151-n may be disposed below one semiconductor structure 120. However, this is merely an example for describing the present invention, and the present invention is not limited thereto. That is, the number of the semiconductor structures 120 connected to one first-$n^{th}$ interconnection line 151-n and the number of the first-$n^{th}$ interconnection lines 151-n disposed below one semiconductor structure 120 may be changed. Hereinafter, for convenience of description, the first-$n^{th}$ interconnection lines 151-n connected to the semiconductor structures 120 of region A are defined as a first-first interconnection line 151-1, a first-second interconnection line 151-2, . . . and a first-$32^{th}$ interconnection line 151-32 in order from the left.

For example, the first-first interconnection line 151-1 may be electrically connected to eight semiconductor structures 120 disposed in a first column at a left side of region A. Here, a column is defined as a vertical line in a first direction (y-axis direction) in the substrate 170, and a row is defined as a horizontal line in a second direction (x-axis direction) in the substrate 170. In addition, the first direction and the second direction are defined as directions perpendicular to a third direction (z-axis direction) which is a thickness direction of the semiconductor structure.

In this regard, referring to FIGS. 8 and 9, the first-first interconnection line 151-1 may include a first-1a interconnection line 151-1a, a first-1b interconnection line 151-1b, a first-1c interconnection line 151-1c, and a first-1d interconnection line 151-1d.

In addition, the first-first interconnection line 151-1 may be electrically connected to the eight semiconductor structures disposed in the first column at the left side of region A. Similarly, the first-second interconnection line 151-2 may be electrically connected to eight semiconductor structures disposed in a second column at the left side of region A, and the same may be applied up to the first-$32^{th}$ interconnection line 151-32. On the other hand, the 1-$17^{th}$ to first-$32^{th}$ interconnection lines 151-17 to 151-32 may be electrically connected to semiconductor structures of region C and region D.

The plurality of second interconnection lines 152-n (n≥1) may be disposed at left and right sides of the edge P1 of the substrate 170. In this case, one second-$n^{th}$ interconnection line 152-n may be electrically connected to eight semiconductor structures.

16 second-$n^{th}$ interconnection lines 152-n may be disposed at each of left and right sides of the substrate 170. That is, unlike the first-$n^{th}$ interconnection line 151-n, one second-$n^{th}$ interconnection line 152-n may be disposed below one semiconductor structure 120. However, this is merely an example for describing the present invention, and the present invention is not limited thereto. That is, the number of the semiconductor structures connected to one second-$n^{th}$ interconnection line 152-n and the number of the second-$n^{th}$ interconnection lines 152-n disposed below one semiconductor structure may be changed.

Hereinafter, for convenience of description, the second interconnection lines 152-n disposed at the left side of the substrate 170 are defined as a second-first interconnection line 152-1, a second-second interconnection line 152-2, . . . and a 2-$16^{th}$ interconnection line 152-16 in order from the top. Similarly, the second interconnection lines 152-n disposed at the right side of the substrate 170 may include 2-$17^{th}$ to 2-$32^{th}$ interconnection lines 152-17 to 152-32 in order from the top.

The second-first interconnection line 152-1 may be electrically connected to eight semiconductor structures disposed in a first row of an upper side of region C. Specifically, the second-first interconnection line 152-1 may be electrically connected to second conductivity-type semiconductor layers of the eight semiconductor structures disposed in the first row of the upper side.

Similarly, the second-second interconnection line 152-2 may be electrically connected to eight semiconductor structures disposed in a second row of the upper side of region C. The same may be applied up to the 2-$16^{th}$ interconnection line 152-16.

In addition, the same may be applied to region D. That is, the second-$n^{th}$ interconnection lines 152-n may be electrically connected to eight semiconductor structures. For example, one second-$n^{th}$ interconnection line 152-n may be electrically connected to eight semiconductor structures in each row of region D in order from the top of the substrate 170.

As described above, the first-$n^{th}$ interconnection lines 151-n may each be electrically connected to eight semiconductor structures in region A and region B (or region C and region D) in order from the left.

In addition, the second-$n^{th}$ interconnection lines 152-n may each be electrically connected to eight semiconductor structures in region C and region D in order from the top.

The plurality of first pads 181-n (n≥1) may be disposed at the upper and lower sides of the edge P1 of the substrate 170. In this case, four first-$n^{th}$ pads 181-n may be disposed on the first interconnection line 151-n. That is, a total of 128 first-$n^{th}$ pads 181-n may be disposed with respect to 32 first interconnection lines 151-n.

For example, a first-first pad 181-1 may include a first-1a pad 181-1a, a first-1b pad 181-1b, a first-1c pad 181-1c, and a first-1d pad 181-1d which are disposed in order from the left at the upper side of the substrate 170. The first-1a pad 181-1a, the first-1b pad 181-1b, the first-1c pad 181-1c, and the first-1d pad 181-1d may be electrically connected to the first-1a interconnection line 151-1a, the first-1b interconnection line 151-1b, the first-1c interconnection line 151-1c, and the first-1d interconnection line 151-1d, respectively.

The first-1a interconnection line 151-1a, the first-1b interconnection line 151-1b, the first-1c interconnection line 151-1c, and the first-1d interconnection line 151-1d may be connected to first conductivity-type semiconductor layers of two adjacent semiconductor structures of the eight semiconductor structures.

In addition, the plurality of first-$n^{th}$ pads 181-n may be defined as a first-first pad 181-1, a first-second pad 181-2, . . . and a first-$16^{th}$ pad 181-16 in order from the left at the upper side of the substrate. The plurality of first-$n^{th}$ pads 181-n may be defined as first-$17^{th}$ to first-$32^{th}$ pads 181-17 to 181-32 in order from the left at the lower side of the substrate.

Accordingly, the first-first to first-$16^{th}$ pads 181-1 to 181-16 may be electrically connected to the first-first to first-$16^{th}$ interconnection lines 151-1 to 151-16 disposed in region A.

The first-$17^{th}$ to first-$32^{th}$ pads 181-17 to 181-32 may be electrically connected to the first-$17^{th}$ to first-$32^{th}$ interconnection lines 151-17 to 151-32 disposed in region B.

The plurality of second pads 182-n (n≥1) may be disposed at the edge P1 of the substrate 170. In this case, second-$n^{th}$ pads 182-n may be disposed on second-$n^{th}$ interconnection lines 152-n, respectively. In addition, as described above, 16 second-$n^{th}$ pads 182-n may be disposed at each of the left and right sides of the substrate 170. Furthermore, one second-$n^{th}$ pad 182-n may be electrically connected to eight semiconductor structures in the same row. However, this is merely an example for describing the present invention, and the present invention is not limited thereto.

First, the second-$n^{th}$ pads 182-n disposed at the left side of the substrate 170 may be defined as a second-first pad 182-1, a second-second pad 182-2, . . . and a second-$16^{th}$ pad 182-16 in order from the top.

Here, the second-first pad 182-1 may be disposed on the second-first interconnection line 152-1 and may be electrically connected. The second-first pad 182-1 may be electrically connected to eight semiconductor structures disposed in the first row of the upper side of region C. The same may be applied up to the second-$16^{th}$ pad 182-16. In addition, the same may be applied to the second pads 182-17 to 182-32 disposed at the right side of the substrate 170.

Referring to FIG. 2 again, a fluorescent layer 190 may be disposed on the plurality of semiconductor structures 120 and the passivation layer 163 to cover the plurality of semiconductor structures 120 (although not shown in FIG. 3, the fluorescent layer 190 may be disposed on the passivation layer 163). Accordingly, the fluorescent layer 190 may absorb light emitted from the plurality of semiconductor structures 120 and convert the absorbed light into light in a different wavelength range to emit the converted light. For example, the fluorescent layer 190 may emit white light.

As described above, the plurality of first and second pads 181-n and 182-n may be disposed along the edge P1 of the substrate 170. In addition, the plurality of semiconductor structures may be disposed inside the plurality of pads 181-n and 182-n. That is, the plurality of first and second pads 181-n and 182-n may be disposed to surround the plurality of semiconductor structures. In addition, the plurality of first interconnection lines 151-n and second interconnection lines 152-n may extend from the first and second conductivity-type semiconductor layers 121 and 122 or the first and second electrodes 141 and 142 to the edge of the substrate and be connected to the plurality of pads 181-n and 182-n. The plurality of semiconductor structures may not be individually formed and may be formed by growing the first to second conductivity-type semiconductor layers 121 and 122 and the active layer 123 all at once and isolating the first to second conductivity-type semiconductor layers 121 and 122 and the active layer 123 in a unit of one chip (device) through etching. Therefore, processability can be improved, and concurrently, an emission region can be increased.

Referring to FIG. 3, in the semiconductor device package according to the embodiment, as described above, the plurality of semiconductor structures may be disposed to be spaced apart from each other. Hereinafter, descriptions will be given based on a first semiconductor structure 120-1 and a second semiconductor structure 120-2 which are disposed adjacent to each other.

The first-first interconnection line 151-1 and the first-second interconnection line 151-2 may be disposed below the first semiconductor structure 120-1 and the second semiconductor structure 120-2, and the first semiconductor structure 120-1 and the second semiconductor structure 120-2 may be electrically connected to the first-first interconnection line 151-1 and the first-second interconnection line 151-2.

Specifically, in the first semiconductor structure 120-1, a first conductivity-type semiconductor layer 121 may be electrically connected to the first-1c interconnection line 151-1c, and in the second semiconductor structure 120-1, a first conductivity-type semiconductor layer 121 may be electrically connected to the first-2c interconnection line 151-2c. However, as described above, the connection between the semiconductor structure and the interconnection line may be changed according to the position of the semiconductor structure in the semiconductor device package.

The first semiconductor structure 120-1 and the second semiconductor structure 120-2 may each include an outermost surface. Hereinafter, descriptions will be given based on the first semiconductor structure 120-1 and FIG. 4.

The first conductivity-type semiconductor layer 121 may have a maximum height h2 of several micrometers or less and thus may provide a plurality of light beams through an outermost surface 121a of the first conductivity-type semiconductor layer due to having such a minute height. Here, the maximum height may be a length between an upper surface of the first conductivity-type semiconductor layer and an upper surface of the active layer (bottom surface of the first conductivity-type semiconductor layer).

Referring to FIG. 5, the first semiconductor structure 120-1 may provide a plurality of light beams through an outer surface of the first conductivity-type semiconductor layer 120-1, and thus, optical interference may occur in the second semiconductor structure 120-2 adjacent thereto. Thus, the maximum height h1 of the outermost surface 121a of the first conductivity-type semiconductor layer 121 on a lower surface 121c of the first conductivity-type semiconductor layer 121 may be controlled to adjust an amount of light emitted through a side surface of the first semiconductor structure 120-1, and optical interference between adjacent second semiconductor structures 120-2 may be suppressed to improve a contrast ratio. In the semiconductor structure according to the embodiment, the maximum height h1 of the outermost surface of the first conductivity-type semiconductor layer may be in a range of 1 μm to 3 μm.

Thus, the semiconductor device package according to the embodiment can provide an improved contrast ratio.

In addition, referring to FIG. 6, a degree of interference between light emitted through the outermost s surface 121a of the first conductivity-type semiconductor layer 121 in the first semiconductor structure 120-1 and light emitted from the second semiconductor structure 120-2 may be adjusted according to a minimum separation distance W1 between the first conductivity-type semiconductor layer 120-1 and the second semiconductor structure 120-2.

Thus, in the semiconductor device package according to the embodiment, a length ratio of the maximum height h1 of the side surface of the first conductivity-type semiconductor layer to the separation distance W1 between adjacent semiconductor structures may be in a range of 1:3 to 1:60.

When the length ratio is smaller than 1:5, there may be a limitation in that, due to a decrease in separation distance between the adjacent semiconductor structures, optical interference between the semiconductor structures is increased and thus a contrast ratio is lowered. When the length ratio is greater than 1:60, there is a process limitation in controlling the maximum height of the side surface of the first conductivity-type semiconductor structure, and there is a problem in that electrical characteristics are degraded due to current crowding during current injection.

Specifically, referring to FIG. 4, the outermost surface 121a of the first conductivity-type semiconductor layer 121 may be the only surface exposed in the first semiconductor structure 120-1 when the passivation layer 163 is not present.

In addition, the first conductivity-type semiconductor layer 121 may include the outermost surface 121a, an upper surface 121b, the lower surface 121c, a side surface 121d, and a bottom surface 121e. First, in the first conductivity-type semiconductor layer 121, the outermost surface 121a may be a surface which is disposed on the channel layer 130 and is in contact with the passivation layer 163. In the first conductivity-type semiconductor layer 121, the upper surface 121b may be a surface disposed outside in a direction from the active layer 123 to the first conductivity-type semiconductor layer 121 and may have uneven patterns as described below. In the first conductivity-type semiconductor layer 121, the lower surface 121c may be a surface exposed by the channel layer 130, may be in contact with the channel layer 130, and may not overlap the active layer 123 in a thickness direction thereof.

In addition, the side surface 121d of the first conductivity-type semiconductor layer 121 may be a surface formed by mesa-etching the semiconductor structure 120 up to a partial region of the first conductivity-type semiconductor layer 121 and may be an inclined surface. A side surface of the second conductivity-type semiconductor layer 122 and a side surface of the active layer 123 may also be exposed by the etching and may be inclined surfaces. The exposed side surface of the second conductivity-type semiconductor layer 122, the exposed side surface of the active layer 123, and the exposed side surface 121d of the first conductivity-type semiconductor layer 121 may have the same inclination angle. However, the present invention is not limited thereto, and the side surfaces may be variously modified through a process.

In the first conductivity-type semiconductor layer 121, the side surface 121d may be a surface which is in contact with the channel layer 130, is surrounded by the channel layer 180, and is in contact with the upper surface of the active layer 123. In the first conductivity-type semiconductor layer 121, the bottom surface 121e may be a surface which is in contact with the active layer 123 and is the same surface as the upper surface of the active layer.

In the first conductivity-type semiconductor layer according to the embodiment, a maximum height h2 of the first conductivity-type semiconductor layer 121 may be different from the maximum height of the outermost surface 121a of the first conductivity-type semiconductor layer 121. Due to such a configuration, an area, in which the first conductivity-type semiconductor layer and the active layer overlap in the thickness direction (z-direction), can be reduced, thereby reducing light generation through the outermost surface 121a of the first conductivity-type semiconductor layer 121 to improve a contrast ratio.

Referring to FIG. 5, a minimum separation distance W1 between adjacent semiconductor structures 120 may be smaller than a maximum width W2 of the semiconductor structure.

According to the embodiment, a length ratio of the minimum separation distance W1 between the adjacent semiconductor structures 120 to the maximum width W2 of the semiconductor structure may be in a range of 1:5 to 1:20. When the length ratio is smaller than 1:5, there may be a limitation in that, due to a decrease in distance between the adjacent semiconductor structures, light emitted through an outer surface interferes with an adjacent semiconductor structure. When the length ratio is greater than 1:20, there is a problem in that, due to an increase in area of the first conductivity-type semiconductor layer, current spreading is decreased in the semiconductor structure.

FIG. 10 is a sectional view of a semiconductor device package according to a second embodiment.

A semiconductor device package 100B according to the second embodiment may include the substrate 170, the plurality of semiconductor structures 120, the bonding layer 171, the channel layer 130, the first electrode 141, the second electrode 142, the reflective layer 143, the first interconnection line 151, the second interconnection line 152, the first insulating layer 161, the second insulating layer 162, the passivation layer 163, the first pad 181, and the second pad 182 which have been described with reference to FIG. 1, and the above-described contents may be equally applied.

However, an upper surface 121b of a first conductivity-type semiconductor layer 121 may include a first surface 121b-1, a second surface 121b-2 disposed below the first surface 121b-1, and an inclined surface 121b-3 positioned between the first surface 121b-1 and the second surface 121b-2. In addition, a plurality of first surfaces 121b-1, a plurality of second surfaces 121b-2, and a plurality of inclined surfaces 121b-3 may be formed, and a side surface of the first conductivity-type semiconductor layer 121 may have a plurality of inclined surfaces to have a step structure.

In addition, in the first conductivity-type semiconductor layer 121, a height h3 from a lower surface 121c exposed by a first recess R1 to the first surface 121b-1 may be greater than a height h4 from the lower surface 121c to the second surface 121b-2 of the first conductivity-type semiconductor layer 121.

In the semiconductor device package according to the second embodiment, a height ratio of the height h4 from the lower surface 121c to the second surface 121b-2 of the first conductivity-type semiconductor layer 121 to the height h3 from the lower surface 121c exposed by the first recess R1 to the first surface 121b-1 may be in a range of 1:1 to 1:10. Accordingly, in the semiconductor device package according to the second embodiment, an amount of light through an outer surface can be reduced to improve a contrast ratio, and a thickness of the first conductivity-type semiconductor layer can be maintained to prevent a decrease in spreading caused by current crowding.

When the height ratio is smaller than 1:1, there is a problem in that luminous flux is lowered due to degradation in electrical characteristics (for example, current spreading) in each semiconductor structure. When the height ratio is greater than 1:10, there is a problem in that, due to light absorption occurring in the first-conductivity-type semiconductor layer, light extraction efficiency is lowered.

In addition, a length of the second surface 121b-2 in a second direction (x-axis direction) may be in a range of 10 μm to 150 μm. Due to such a configuration, a contrast ratio and luminous flux can be maintained. When the length is smaller than 10 μm, the contrast ratio is decreased. When the length is greater than 150 μm, there is a problem in that, due to degradation in electrical characteristics caused by current crowding, the luminous flux is decreased.

Figure 12:
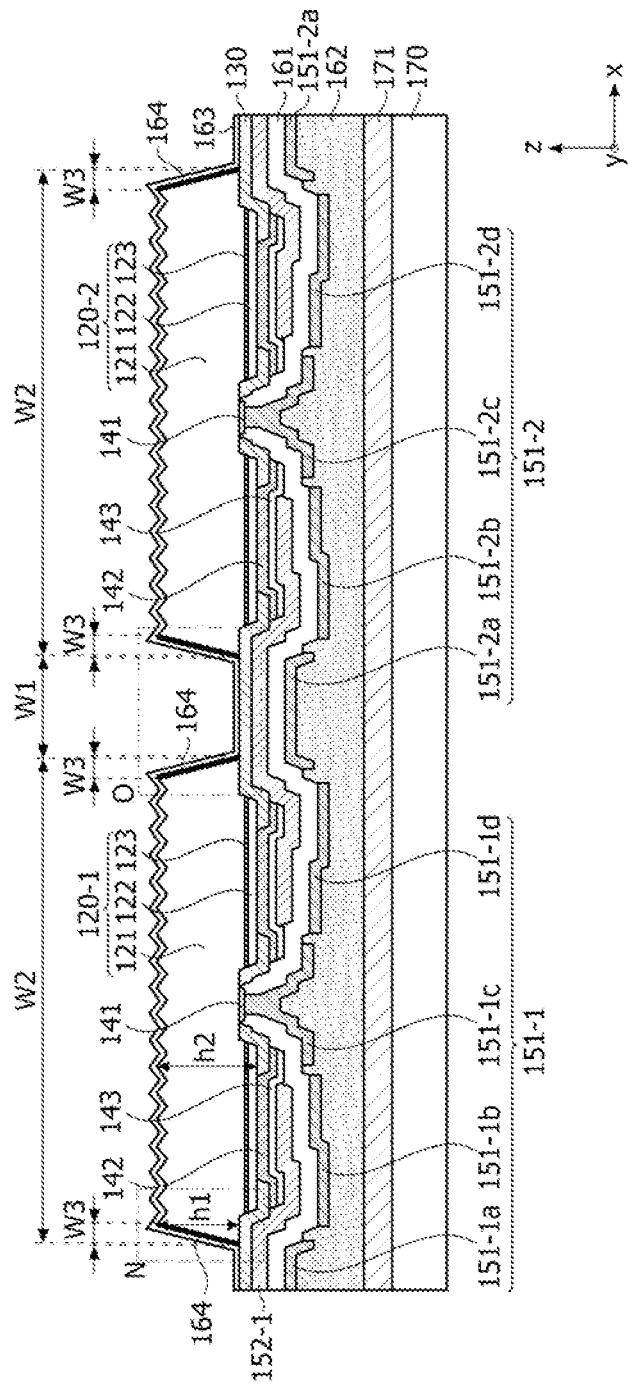
FIG. 12 is a cross-sectional view of the semiconductor device package according to the third embodiment corresponding to FIG. 3.

FIG. 11 is a cross-sectional view of a semiconductor device package according to a third embodiment. FIG. 12 is a cross-sectional view of the semiconductor device package according to the third embodiment corresponding to FIG. 3. FIG. 13 is an enlarged view of region N in FIG. 12. FIG. 14 is an enlarged view of region O in FIG. 12. FIG. 15 is a graph showing a contrast ratio according to an intermediate layer.

Referring to FIG. 11, a semiconductor device package 100C according to the third embodiment may include a substrate 170, a plurality of semiconductor structures 120 disposed to be spaced apart from each other, and intermediate layers 164 disposed on side surfaces of the semiconductor structures 120.

In addition, the descriptions of the bonding layer 171, the channel layer 130, the first electrode 141, the second electrode 142, the reflective layer 143, the first interconnection line 151, the second interconnection line 152, the first insulating layer 161, the second insulating layer 162, the passivation layer 163, the first pad 181, and the second pad 182, which have been described in the semiconductor device package according to the first embodiment, may be equally applied to the semiconductor device package 100C according to the third embodiment. Therefore, detailed descriptions thereof will be omitted. In addition, when the bonding layer 171, the channel layer 130, the first electrode 141, the second electrode 142, the reflective layer 143, the first interconnection line 151, the second interconnection line 152, the first insulating layer 161, the second insulating layer 162, the passivation layer 163, the first pad 181, and the second pad 182 are associated with the intermediate layer 164, which will be described below, contents described below may be applied to corresponding components.

Specifically, the intermediate layer 164 may be disposed on an outer surface of a first conductivity-type semiconductor layer 121. Specifically, the intermediate layer 164 may be in direct contact with the first conductivity-type semiconductor layer 121 and may be disposed inside the passivation layer 163 disposed on the outer surface of the first conductivity-type semiconductor layer 121 or on an outer surface of the passivation layer 163. The specific position of the intermediate layer 164 will be described in detail with reference to FIGS. 13, 16, and 17 below.

The intermediate layer 164 may prevent light emitted to the outer surface of the first conductivity-type semiconductor layer 121 from being transmitted and may reflect the light, thereby preventing occurrence of optical interference with light emitted from an adjacent semiconductor structure. Accordingly, the intermediate layer 164 according to the embodiment may suppress optical interference between the plurality of semiconductor structures 120, thereby improving a contrast ratio of the semiconductor device package.

The intermediate layer 164 may be made of a material having low light transmittance. Specifically, the intermediate layer 164 may be made of any one selected from among metal, ceramic, and semiconductor materials. Preferably, the intermediate layer 164 may be made of a ceramic or semiconductor material to improve heat resistance of the semiconductor device package. For example, the intermediate layer 164 may include Si, SiC, TiN, $TiO_2$, or the like, but the present invention is not limited to such materials.

In addition, the intermediate layer 164 may include a plurality of layers to have low light transmittance and, at the same time, to prevent permeation of external moisture and contaminants, thereby improving reliability of the semiconductor device package.

In addition, light emitted to a side surface can be blocked by the intermediate layer 164, thereby improving a contrast ratio of the semiconductor device package. Accordingly, a thickness of a fluorescent layer 190 can also be adjusted.

Specifically, a length ratio of a maximum height h1 of an outermost surface 121a of the first conductivity-type semiconductor layer 121 to be described below to the thickness of the fluorescent layer 190 may be in a range of 1:1.1 to 1:2.3.

When the length ratio is smaller than 1:1.1, there is a problem in that, due to a decrease in thickness of the fluorescent layer, light uniformity is decreased. However, when the length ratio is greater than 1:2.3, there is a problem in that emitted light moves to a fluorescent layer on an adjacent semiconductor structure, and thus crosstalk is generated.

Referring to FIGS. 12 to 15, the intermediate layer 164 may be disposed on the outermost surface 121a of the first conductivity-type semiconductor layer 121. Specifically, the intermediate layer 164 may be disposed between a lower surface 121c of the first conductivity-type semiconductor layer 121 and an upper surface 121b of the first conductivity-type semiconductor layer 121 to be in contact with the outermost surface 121a of the first conductivity-type semiconductor layer 121. The intermediate layer 164 may be disposed to overlap the outermost surface 121a of the first conductivity-type semiconductor layer 121 in a first direction (y-axis direction) and a second direction (x-axis direction), thereby easily blocking light emitted to the outermost surface 121a of the first conductivity-type semiconductor layer 121 from being transmitted. Here, as described above, the first direction (y-axis direction) and the second direction (x-axis direction) are directions perpendicular to a thickness direction (z-axis direction).

In addition, in the first conductivity-type semiconductor layer, a maximum height h2 of the first conductivity-type semiconductor layer 121 may be different from a maximum height h1 of the outermost surface 121a of the first conductivity-type semiconductor layer 121. Due to such a configuration, an area, in which the first conductivity-type semiconductor layer and the active layer overlap in the thickness direction (z-direction), can be reduced, thereby reducing light generation through the outermost surface 121a of the first conductivity-type semiconductor layer 121 to improve a contrast ratio.

In addition, referring to FIG. 15, FIG. 15 shows a contrast ratio indicating a degree of interference between light emitted through the outermost surface 121a of the first conductivity-type semiconductor layer 121 and light emitted from the second semiconductor structure 120-2 as the maximum height h1 of the outermost surface 121a of the first conductivity-type semiconductor layer is controlled when an intermediate layer is present (third embodiment) and when an intermediate layer is not present (first embodiment).

When the intermediate layer is not present, as the maximum height h1 of the outermost surface 121a of the first conductivity-type semiconductor layer is controlled, it can be seen that the light emitted through the outermost surface 121a of the first conductivity-type semiconductor layer 121 is decreased and thus a contrast ratio is improved. However, when the maximum height h1 of the outermost surface 121a of the first conductivity-type semiconductor layer is greater than or equal to a predetermined height, it can be seen that the contrast ratio is not significantly improved.

On the other hand, when the intermediate layer is present, it can be seen that a contrast ratio is improved and maintained regardless of the maximum height h1 of the outermost surface 121a of the first conductivity-type semiconductor layer. Accordingly, in the semiconductor device package according to the third embodiment, it can be seen that a contrast ratio can be improved by arranging the intermediate layer.

In addition, when the intermediate layer is present and the maximum height h1 of the outermost surface 121a of the first conductivity-type semiconductor layer 121 is also controlled to be 3 μm or less, it can be seen that a contrast ratio is slightly improved.

Furthermore, in the semiconductor device package according to the third embodiment, a length ratio of a maximum height h1 of a side surface of the first conductivity-type semiconductor layer to a separation distance W1 between adjacent semiconductor structures may be in a range of 1:3 to 1:60.

When the length ratio is smaller than 1:5, there may be a limitation in that, due to a decrease in separation distance between the adjacent semiconductor structures, optical interference between the semiconductor structures is increased and thus a contrast ratio is lowered. When the length ratio is greater than 1:60, there is a process limitation in controlling the maximum height of the side surface of the first conductivity-type semiconductor structure, and there is a problem in that electrical characteristics are degraded due to current crowding during current injection.

In addition, a width ratio of a maximum width W3 of the outermost surface 121a of the first conductivity-type semiconductor layer 121 to a maximum width W2 of the semiconductor structure may be in a range of 1:10 to 1:60.

When the width ratio is smaller than 1:10, there is a limitation that an amount of light emitted through the semiconductor structure is small. When the width ratio is greater than 1:60, there is a problem in that light is emitted to an upper portion of an adjacent semiconductor structure to generate crosstalk or the like.

In addition, a length ratio of a thickness d1 of the intermediate layer 164 to the maximum height h1 of the outermost surface 121a of the first conductivity-type semiconductor layer 121 on the lower surface 121c of the first conductivity-type semiconductor layer 121 may be in a range of 1:11.25 to 1:30.

When the length ratio is smaller than 1:11.25, there are problems in that a manufacturing process is difficult, the passivation layer and a texture structure are difficult to form, and light emitted upward is partially absorbed. When the length ratio is greater than 1:30, there may be problems in that the intermediate layer 164 may become thinner so that a process of the intermediate layer 164 is difficult, the intermediate layer 164 may not be disposed in a partial region of the outermost surface 121a of the first conductivity-type semiconductor layer 121, and due to an increase in light transmittance, light may be emitted through a side surface.

FIG. 16 is a cross-sectional view of a semiconductor device package according to a fourth embodiment.

Referring to FIG. 16, a semiconductor device package 100D according to the fourth embodiment may include a substrate 170, a plurality of semiconductor structures 120 disposed to be spaced apart from each other, and intermediate layers 164 disposed on side surfaces of the semiconductor structures 120.

In addition, the descriptions of the bonding layer 171, the channel layer 130, the first electrode 141, the second electrode 142, the reflective layer 143, the first interconnection line 151, the second interconnection line 152, the first insulating layer 161, the second insulating layer 162, the first pad 181, and the second pad 182, which have been described in the semiconductor device package according to the first embodiment, may be equally applied to the semiconductor device package 100D according to the fourth embodiment. Therefore, detailed descriptions thereof will be omitted. In addition, when the bonding layer 171, the channel layer 130, the first electrode 141, the second electrode 142, the reflective layer 143, the first interconnection line 151, the second interconnection line 152, the first insulating layer 161, the second insulating layer 162, the first pad 181, and the second pad 182 are associated with the intermediate layer 164 and a passivation layer 163 which are to be described below, contents described below may be applied to corresponding components. However, only a portion of the passivation layer 163 is illustrated as being disposed on the semiconductor structure 120, but the present invention is not limited thereto.

Specifically, the intermediate layer 164 may be disposed inside the passivation layer 163 and may be disposed to overlap an outermost surface of a first conductivity-type semiconductor layer 121 in a second direction (x-axis direction).

Accordingly, the passivation layer 163 may include a plurality of layers 163a and 163b. For example, a first passivation layer 163a may be disposed to be in contact with the outermost surface and a portion of an upper surface of the first conductivity-type semiconductor layer 121. The intermediate layer 164 may be disposed to be in contact with an outermost surface of the first passivation layer 163a, and a second passivation layer 163b may be disposed on the intermediate layer 164. Thus, since the second passivation layer 163b is disposed on the intermediate layer 164 and the first insulating layer 131, when defects are generated in the passivation layer 163b, the intermediate layer 164 and the first passivation layer 163a may secondarily prevent permeation of external moisture and/or other contaminants, and light emitted from an interface to a side surface of the semiconductor structure 120 may be reflected. In an example, when the first passivation layer 163a and the second passivation layer 163b are formed as one layer, cracks, internal defects, and the like may be easily propagated in a vertical direction. Therefore, external moisture or contaminants may be introduced into the semiconductor structure 120 through defects exposed to the outside, thereby resulting in degradation in reliability.

In addition, the intermediate layer 164 may be made of a non-insulating material. For example, even when the intermediate layer 164 is a resistor, the intermediate layer 164 may be disposed inside the passivation layer 163 and may not be electrically connected to the first conductivity-type semiconductor layer 121 and thus may not affect electrical characteristics such as a current.

FIG. 17 is a cross-sectional view of a semiconductor device package according to a fifth embodiment.

A semiconductor device package 100E according to the fifth embodiment may include the substrate 170, the plurality of semiconductor structures 120, the bonding layer 171, the channel layer 130, the first electrode 141, the second electrode 142, the reflective layer 143, the first interconnection line 151, the second interconnection line 152, the first insulating layer 161, the second insulating layer 162, the passivation layer 163, the first pad 181, the second pad 182, and the intermediate layer 164 which have been described with reference to FIG. 11. Excluding the intermediate layer 164, the above-described contents may be equally applied. However, only a portion of the passivation layer 163 is illustrated as being disposed on the semiconductor structure 120, but the present invention is not limited thereto.

Specifically, the intermediate layer 164 may be disposed on the passivation layer 163 and may be disposed to overlap an outermost surface of a first conductivity-type semiconductor layer 121 in a second direction (x-axis direction).

Specifically, the passivation layer 163 may be disposed to cover the outermost surface of the first conductivity-type semiconductor layer 121 so that an outermost surface of the passivation layer 163 may have an area that is greater than that of the outermost surface of the first conductivity-type semiconductor layer 121. In addition, since the intermediate layer 164 is disposed to cover both the outermost surface of the first conductivity-type semiconductor layer 121 and the outermost surface of the passivation layer 163, the intermediate layer 164 may have an area that is greater than that of the outermost surface of the first conductivity-type semiconductor layer 121 and that of the outermost surface of the passivation layer 163.

Accordingly, in the semiconductor device package 100E according to the fifth embodiment, a maximum height of the intermediate layer 164 may be greater than a maximum height of the outermost surface of the first conductivity-type semiconductor layer 121 and a maximum height of the outermost surface of the passivation layer 163. Due to such a configuration, in the semiconductor device package 100E according to the fifth embodiment, the intermediate layer 164 may prevent light emitted toward an adjacent semiconductor structures from being transmitted as much as possible as compared with FIGS. 11 and 16, thereby suppressing occurrence of optical interference between adjacent semiconductor structures. Accordingly, a contrast ratio can be improved.

FIGS. 18A to 18C are modified examples of FIG. 11.

First, referring to FIG. 18A, a semiconductor device package 100F according to the modified example may include the substrate 170, the plurality of semiconductor structures 120, the bonding layer 171, the channel layer 130, the first electrode 141, the second electrode 142, the reflective layer 143, the first interconnection line 151, the second interconnection line 152, the first insulating layer 161, the second insulating layer 162, the passivation layer 163, the first pad 181, the second pad 182, and the intermediate layer 164 which have been described with reference to FIG. 11. Excluding the intermediate layer 164, the above-described contents may be equally applied. However, only a portion of the passivation layer 163 is illustrated as being disposed on the semiconductor structure 120, but the present invention is not limited thereto.

The intermediate layer 164 may include a first intermediate layer 164a and a second intermediate layer 164b. First, as described with reference to FIG. 11, the first intermediate layer 164a may be disposed on an outermost surface of a first conductivity-type semiconductor layer 121 to be in contact with the outermost surface of the first conductivity-type semiconductor layer 121. In this case, the second intermediate layer 164b may extend from the first intermediate layer 164a to be disposed on a portion of an upper surface of the first conductivity-type semiconductor layer 121.

Thus, in the semiconductor device package 100F according to the modified example, the intermediate layer 164 may extend from an outermost portion to a portion of the upper surface of the first conductivity-type semiconductor layer 121 and thus may allow light to be emitted to an upper portion of the semiconductor structure 120 as much as possible rather than to a side surface of the semiconductor structure 120. Accordingly, it is possible to further suppress occurrence of optical interference between adjacent semiconductor structures 120.

Specifically, a width ratio of a maximum width W4 of the second intermediate layer 164b to a maximum width W2 of the semiconductor structure 120 may be in a range of 1:20 to 1:30.

When the width ratio is smaller than 1:20, there is a problem in that, due to occurrence of optical interference between adjacent semiconductor structures, a contrast ratio is lowered. When the width ratio is greater than 1:60, there may be a problem in that the second intermediate layer 164b absorbs light emitted upward and thus an amount of light is decreased.

Accordingly, since the width ratio of the maximum width W4 of the second intermediate layer 164b to the maximum width W2 of the semiconductor structure 120 may be assumed to be in a range of 1:20 to 1:30, without significantly reducing an amount of light extracted to an upper portion of the semiconductor structure, it is possible to prevent light from interfering with an upper portion of an adjacent semiconductor structure to improve a contrast ratio.

In addition, the extended second intermediate layer 164b may be equally applied to the semiconductor device package according to the fourth embodiment described with reference to FIG. 16 and the semiconductor device package according to the fifth embodiment described with reference to FIG. 17.

In addition, although not shown, a plurality of intermediate layers may be provided and may be disposed in at least two of a position between the outermost surface of the first conductivity-type semiconductor layer and the passivation layer, a position inside the passivation layer, and a position on the passivation layer. That is, in the semiconductor device packages according to the various embodiments described above, the positions, structures, and the like of the intermediate layers may be combined. For example, in the semiconductor device package, the intermediate layer may be formed in a form in which a plurality of structures of the intermediate layers described above with reference to FIGS. 11, 16, and 17 are reflected.

Referring to FIG. 18B, a semiconductor device package 100G according to another modified example may include the substrate 170, the plurality of semiconductor structures 120, the bonding layer 171, the channel layer 130, the first electrode 141, the second electrode 142, the reflective layer 143, the first interconnection line 151, the second interconnection line 152, the first insulating layer 161, the second insulating layer 162, the passivation layer 163, the first pad 181, the second pad 182, and the intermediate layer 164 which have been described with reference to FIG. 11.

Excluding the intermediate layer 164, the above-described contents may be equally applied. However, only a portion of the passivation layer 163 is illustrated as being disposed on the semiconductor structure 120, but the present invention is not limited thereto.

In addition, as described above, a first conductivity-type semiconductor layer 121 may include an outermost surface 121a, an upper surface 121b, a lower surface 121c, a side surface 121d, and a bottom surface 121e. First, in the first conductivity-type semiconductor layer 121, the outermost surface 121a may be a surface which is disposed on the channel layer 130 and is in contact with the passivation layer 163. In the first conductivity-type semiconductor layer 121, the upper surface 121b may be a surface disposed outside in a direction from the active layer 123 to the first conductivity-type semiconductor layer 121 and may have uneven patterns. In addition, in the first conductivity-type semiconductor layer 121, the lower surface 121c may be a surface exposed by the channel layer 130, may be in contact with the channel layer 130, and may not overlap the active layer 123 in a thickness direction thereof.

In the first conductivity-type semiconductor layer 121, the side surface 121d may be a surface which is in contact with the channel layer 130 and is surrounded by the channel layer and may be in contact with an upper surface of the active layer 123. In the first conductivity-type semiconductor layer 121, the bottom surface 121e may be a surface which is in contact with the active layer 123 and is the same surface as the upper surface of the active layer.

In this case, the side surface 121d of the first conductivity-type semiconductor layer 121 may be a surface formed by mesa-etching the semiconductor structure 120 up to a partial region of the first conductivity-type semiconductor layer 121 and may be an inclined surface. A side surface of a second conductivity-type semiconductor layer 122 and a side surface of the active layer 123 may also be exposed by the etching and may be inclined surfaces.

In this case, the intermediate layer 164 may be disposed below at least one of the lower surface 121c of the first conductivity-type semiconductor layer 121 and the side surface 121d of the first conductivity-type semiconductor layer 121 (in FIG. 18B, although the intermediate layer 164 is illustrated as being disposed below both the lower surface 121c and the side surface 121d, as described above, the intermediate layer 164 may be disposed below any one of the lower surface 121c and the side surface 121d).

For example, a third intermediate layer 164c may be disposed below the lower surface 121c, and a fourth intermediate layer 164d may be disposed below the side surface 121d.

In addition, the fourth intermediate layer 164d may extend to be disposed on an exposed side surface of the active layer 123 and an exposed side surface of the second conductivity-type semiconductor layer 122. Accordingly, it is possible to block light emitted to a side surface of a semiconductor structure 120-1. Specifically, the third intermediate layer 164c and the fourth intermediate layer 164d may also block light which passes through the channel layer 130 and the passivation layer 163 and is emitted to the side surface of the semiconductor structure 120. Accordingly, it is possible to improve a contrast ratio of the semiconductor device package 100G according to another modified example.

In addition, the third intermediate layer 164c and the fourth intermediate layer 164d may be disposed in at least one of a position between the channel layer 130 and the first conductivity-type semiconductor layer 121, a position inside the channel layer 130, and a position below the channel layer 130 (for example, between the channel layer 130 and the first insulating layer 161).

Referring to FIG. 18C, a semiconductor device package 100H according to still another modified example may include the substrate 170, the plurality of semiconductor structures 120, the bonding layer 171, the channel layer 130, the first electrode 141, the second electrode 142, the reflective layer 143, the first interconnection line 151, the second interconnection line 152, the first insulating layer 161, the second insulating layer 162, the passivation layer 163, the first pad 181, the second pad 182, and the intermediate layer 164 which have been described with reference to FIG. 1. Excluding the intermediate layer 164, the above-described contents may be equally applied. In addition, only a portion of the passivation layer 163 is illustrated as being disposed on the semiconductor structure 120, but the present invention is not limited thereto.

In addition, the intermediate layer 164 may further include a fifth intermediate layer 164e disposed between adjacent semiconductor structures.

Specifically, the fifth intermediate layer 164e may extend to an adjacent semiconductor structure along an upper surface of the channel layer 130. Thus, the intermediate layers may be connected to each other between adjacent semiconductor structures.

The fifth intermediate layer 164e may block light emitted from the semiconductor structure 120 from passing through the channel layer 130 and being emitted between adjacent semiconductor structures. Accordingly, it is possible to prevent a contrast ratio from being lowered due to optical interference between a plurality of adjacent semiconductor structures.

Similarly, the fifth intermediate layer 164e may be disposed on the channel layer 130 or inside or on the passivation layer 163 on the channel layer 130.

FIG. 19 is a conceptual view illustrating a display apparatus according to an embodiment.

Referring to FIG. 19, a display apparatus 10 according to the embodiment may include a semiconductor device package 100 including a plurality of semiconductor structures 120, a plurality of data lines DL, a plurality of scan lines SL, a first driving unit 200, a second driving unit 300, and a controller 400.

The semiconductor device package 100 may include one of the semiconductor device packages 100A to 100E according to the first to fifth embodiments described above or one of the semiconductor device packages 100F to 100H according to the modified examples. As described above, the semiconductor device package 100 may include the plurality of semiconductor structures. Here, each of the plurality of semiconductor structures 120 may be one pixel PX.

The plurality of data lines DL may be electrically connected to first interconnection lines connected to the plurality of semiconductor structures 120. The connection of the plurality of data lines DL to the semiconductor structures 120 may be different according to a driving method of the display apparatus 10. For example, the display apparatus 10 may be driven in a 2-time division manner of passive matrix driving. In this case, each of the plurality of data lines DL may be electrically connected to the first interconnection line connected to two semiconductor structures 120. However, as described above, a connection method of the plurality of data lines DL and the first interconnection lines may be different according to the number of time divisions. For example, in a passive matrix driven in a 4-time division manner, one data line DL may be electrically connected to four semiconductor structures 120 (pixels).

In addition, the plurality of data lines DL may apply currents to the semiconductor structures according to signals provided from the first driving unit 200. A plurality of switches (not shown) may be disposed in the plurality of data lines DL, and the first driving unit 200 may provide control signals for switching (turning on or off) the plurality of switches (not shown) to the plurality of switches (not shown). The control signal may be a pulse width modulation (PWM)-type signal. However, the present invention is not limited to such a type.

In addition, the plurality of switches (not shown) may include transistors, for example, field-effect transistors (FETs). Accordingly, the first driving unit 200 may control the plurality of switches (not shown) by adjusting gate voltages applied to the plurality of switches (not shown). However, the present invention is not limited to such a type.

The plurality of scan lines SL may be electrically connected to second interconnection lines connected to the plurality of semiconductor structures 120. Similar to the data lines DL described above, the connection of the plurality of scan lines SL to the semiconductor structures 120 may be different according to a driving method of the display apparatus 10. For example, the display apparatus 10 may be driven in a 2-time division manner of passive matrix driving. In this case, each of the plurality of scan lines SL may be electrically connected to the second interconnection line connected to two semiconductor structures 120. However, as described above, a connection method of the plurality of scan lines SL and the second interconnection lines may be different according to the number of time divisions.

Each scan line SL may be connected to two semiconductor structures 120. In addition, the plurality of scan lines SL may apply currents to the semiconductor structures 120 according to signals provided from the second driving unit 300. A plurality of switches (not shown) may be disposed in the plurality of scan lines SL, and the second driving unit 300 may provide control signals to the plurality of switches (not shown) for switching (turning on or off) the plurality of switches (not shown). The control signal may be a pulse width modulation (PWM)-type signal. However, the present invention is not limited to such a type.

In addition, the plurality of switches (not shown) may include transistors, for example, FETs. Accordingly, the second driving unit 300 may control the plurality of switches (not shown) by adjusting gate voltages applied to the plurality of switches (not shown). However, the present invention is not limited to such a type.

Specifically, the plurality of data lines DL may be electrically connected to a first conductivity-type semiconductor layer of the semiconductor structure 120 through the first interconnection lines, and the plurality of scan lines SL may be electrically connected to a second conductivity-type semiconductor layer of the semiconductor structure 120 through the second interconnection lines. Due to such a configuration, the plurality of data lines DL and the plurality of scan lines SL may inject currents into the plurality of semiconductor structures 120, and thus, the plurality of semiconductor structures 120 may emit light.

That is, the display apparatus 10 according to the embodiment may control the PWM signals provided to the data lines DL and the scan lines SL through the first driving unit 200 and the second driving unit 300, thereby controlling light emission of the plurality of semiconductor structures 120.

The controller 400 may provide control signals to the first driving unit 200 and the second driving unit 300. The controller 400 may determine the number of time divisions for image data input in one frame and may provide control signals corresponding to the determined number of time divisions to the first driving unit 200 and the second driving unit 300. Due to such a configuration, the display apparatus 10 may change the number of time divisions according to image data, but the present invention is not limited thereto.

FIGS. 20A to 20M are views illustrating a method of manufacturing a semiconductor device package according to an embodiment.

Referring to FIG. 20A, an operation of providing a temporary substrate T and forming a semiconductor structure 120 on the temporary substrate T may be performed. That is, a first conductivity-type semiconductor layer 121, an active layer 123, and a second conductivity-type semiconductor layer 122 may be sequentially grown on the temporary substrate T.

The temporary substrate T may include a transparent, conductive, or insulating substrate. The temporary substrate T may be made of a material suitable for semiconductor material growth or may be a carrier wafer. For example, the temporary substrate T may be made of at least one selected from among sapphire ($Al_2O_3$), SiC, Si, GaAs, GaN, ZnO, Si, GaP, InP, Ge, and $Ga_2O_3$, but the present invention is not limited to such a type.

The semiconductor structure 120 may include the first conductivity-type semiconductor layer 121, the second conductivity-type semiconductor layer 122, and the active layer 123 disposed between the first conductivity-type semiconductor layer 121 and the second conductivity-type semiconductor layer 122. The semiconductor structure 120 may be grown through a vapor deposition method such as a metal organic chemical vapor deposition (MOCVD) method, a molecular beam epitaxy (MBE) method, or a hydride vapor phase epitaxy (HVPE) method, but the present invention is not limited thereto.

Referring to FIG. 20B, an operation of mesa-etching a portion of the semiconductor structure 120 to form a first recess R1 may be performed. The first recess R1 may be formed to have a predetermined depth from the second conductivity-type semiconductor layer 122. The first recess R1 may be formed down to a partial region of the first conductivity-type semiconductor layer 121. That is, portions of the second conductivity-type semiconductor layer 122, the active layer 123, and the first conductivity-type semiconductor layer 121 may be etched. Accordingly, a side surface and an exposed lower surface of the first conductivity-type semiconductor layer 121, a side surface of the active layer 123, and a side surface and an upper surface of the second conductivity-type semiconductor layer 122 may be exposed.

Referring to FIG. 20C, an operation of forming a channel layer 130 on the semiconductor structure 120 may be performed. In this case, the channel layer 130 may be formed only in a partial region of the semiconductor structure 120. That is, the channel layer 130 may expose portions of the first conductivity-type semiconductor layer 121 and the second conductivity-type semiconductor layer 122.

Specifically, the channel layer 130 may cover a portion of the first recess R1. In addition, the channel layer 130 may cover the side surface and a portion of the upper surface of the second conductivity-type semiconductor layer 122 adjacent to the first recess R1. Furthermore, the channel layer 130 may expose a portion of the first conductivity-type semiconductor layer 121 through another hole in the first recess R1. A first electrode 141 to be described below may be disposed in the first recess R1.

The channel layer 130 may expose a portion of the second conductivity-type semiconductor layer 122 through a first hole H1 to be described below. That is, the first hole H1 may be a region of the second conductivity-type semiconductor layer 122, in which the channel layer 130 is not formed. A second electrode 142 to be described below may be disposed in the first hole H1.

Meanwhile, the first hole H1 may be formed by forming the channel layer 130 on the second conductivity-type semiconductor layer 122 and then etching a partial region of the channel layer 130. Alternatively, a region, in which the first hole H1 is to be formed, may be covered using a mask or the like, and then, the channel layer 130 may be formed only in a partial region of the second conductivity-type semiconductor layer 122. However, the present invention is not limited to such methods.

Referring to FIG. 20D, an operation of arranging the first electrode 141 and the second electrode 142 in the hole formed in the first recess R1 and the first hole H1 may be performed. The first electrode 141 may be disposed in the first recess R1. Specifically, the first electrode 141 may pass through the channel layer 130 in the first recess R1 and be disposed in another hole. The first electrode 141 may be electrically connected to the first conductivity-type semiconductor layer 121.

The second electrode 142 may be disposed in the first hole H1. The second electrode 142 may be electrically connected to the second conductivity-type semiconductor layer 122 exposed through the first hole H1.

On the other hand, in the drawing, two second electrodes 142 are illustrated as being provided to be spaced apart from each other, but the two second electrodes 142 may be substantially connected. That is, a hole is formed in the second electrode 142, and thus, when viewed in a cross-sectional view, the two second electrodes may be illustrated as being spaced apart from each other.

In addition, a reflective layer 143 may be formed on the second electrode 142. The reflective layer 143 may be disposed to cover an upper surface of the second electrode to reflect light generated in the active layer 123 toward the first conductivity-type semiconductor layer 121, but the present invention is not limited thereto.

Referring to FIG. 20E, an operation of arranging a second interconnection line 152 on the second electrode 142 may be performed. The second interconnection line 152 may extend in a direction toward a side surface of the temporary substrate T. For example, the second interconnection line 152 may include a second end portion 152c extending to an upper portion of the channel layer 130 disposed at an end of the temporary substrate T.

Accordingly, the second end portion 152c may overlap the channel layer 130 in a direction perpendicular to the temporary substrate T. The second interconnection line 152 and a pad may be electrically connected by the second end portion 152c. Therefore, the end portion of the second interconnection line 152 may be easily connected to a second pad.

Referring to FIG. 20F, an operation of arranging a first insulating layer 161 to cover the channel layer 130, the first electrode 141, the second electrode 142, and the second interconnection line 152 may be performed. The second interconnection line 152 and a first interconnection line 151 to be described below may be electrically insulated by the first insulating layer 161.

Referring to FIG. 20G, an operation of forming the first interconnection line 151 so as to pass through the first insulating layer 161 and arranging a second insulating layer 162 may be performed. Here, the first interconnection line 151 may include a first through-portion 151a, a first connection portion 151b, and a first end portion 151c.

The first through-portion 151a may extend from the first electrode 141 toward one surface of the first insulating layer 161. The first connection portion 151b may be bent from the first through-portion 151a and extend along one surface of the first insulating layer 161. The first end portion 151c may extend in a direction toward the end of the temporary substrate T. Therefore, the first end portion 151c of the first interconnection line 151 may be easily connected to a pad, which will be described below.

The first through-portion 151a may be disposed to pass through the first insulating layer 161, and the first connection portion 151b may be disposed on one surface of the first insulating layer 161. In this case, a hole is formed from one surface of the first insulating layer 161 toward the first electrode 141, and a first region 151a may be disposed inside the hole.

In addition, the first end portion 151c may be disposed to extend to the upper portion of the channel layer 130 disposed at the end of the temporary substrate T. That is, the first end portion 151c may overlap the channel layer 130 in the direction perpendicular to the temporary substrate T. The first interconnection line 151 and a pad may be electrically connected by the first end portion 151c.

After the first interconnection line 151 is formed, the second insulating layer 162 may be disposed to cover the first insulating layer 161 and the first interconnection line 151. The first interconnection line 151 may be insulated and protected by the second insulating layer 162.

Referring to FIG. 20H, an operation of bonding a substrate 170 onto the second insulating layer 162 may be performed. In this case, a first bonding layer 171a may be disposed on the substrate 170, and a second bonding layer 171b may be disposed on the second insulating layer 162. That is, the second insulating layer 162 and the substrate 170 may be bonded by the first and second bonding layers 171a and 171b being bonded.

Referring to FIG. 20I, an operation of separating the temporary substrate T from the semiconductor structure 120 may be performed. In this case, the temporary substrate T may be removed by a laser lift-off (LLO) method using an excimer laser or the like. Specifically, when light having energy greater than or equal to band gap energy of the substrate is irradiated onto the temporary substrate T, the temporary substrate T may absorb the energy to be decomposed. That is, gas molecules of a material included in the temporary substrate T may be generated to separate the temporary substrate T from the semiconductor structure 120.

Meanwhile, when the temporary substrate T is separated, the semiconductor structure 120 may be supported by the substrate 170. In addition, heat generated in an LLO process may be effectively dissipated by the substrate 170.

Referring to FIG. 20J, a side portion of the semiconductor structure 120 may be etched, and thus, isolation may be performed the semiconductor structure. The semiconductor structure 120 may be divided into a plurality of pieces through the isolation. Therefore, one semiconductor structure 120 may be isolated into a plurality of semiconductor structures in a chip unit. In this case, the plurality of semiconductor structures may be disposed to be spaced apart from each other by a predetermined distance.

In addition, a portion of the first conductivity-type semiconductor layer 121 is etched, and thus, an outermost surface and an upper surface of the first conductivity-type semiconductor layer may be exposed.

In addition, the channel layer 130 may be partially exposed. The etching may be adjusted at the channel layer 130 and the first and second end portions 151c and 152c of the first and second interconnection lines 151 and 152 such that the first interconnection line 151 and the second interconnection line 152 are disposed below the exposed channel layer 130, but the present invention is not limited thereto.

When the semiconductor structure 120 is etched, the channel layer 130 can protect components positioned below the channel layer 130 to minimize damage that may occur in a manufacturing process.

In addition, although only one first interconnection line 151 and one second interconnection line 152 electrically connected to one first conductivity-type semiconductor layer 121 and one second conductivity-type semiconductor layer 122 are illustrated in the drawings, substantially, a plurality of first interconnection lines 151 and a plurality of second interconnection lines 152 may be provided. Furthermore, each of the first and second interconnection lines 151 and 152 may be electrically connected to the plurality of semiconductor structures 120. That is, in FIGS. 20E and 20G, one first interconnection line 151 and one second interconnection line 52 are illustrated as being formed, but as described above, a plurality of first interconnection lines 151 and a plurality of second interconnection lines 152 connected to a plurality of semiconductor structures in a chip unit may actually be provided.

Referring to FIG. 20K, an operation of forming an uneven structure on the semiconductor structure 120 may be performed. Specifically, the uneven structure may be formed on the first conductivity-type semiconductor layer 121. Light extraction efficiency of the semiconductor device package can be improved due to the uneven structure.

Referring to FIG. 20L, an operation of arranging a passivation layer 163 on the semiconductor structure 120 and the exposed channel layer 130 and forming holes H2-1 and H2-2 such that the end portions 151c and 152c of the interconnection lines 151 and 152 are exposed may be performed. In this case, the holes H2-1 and H2-2 may be formed through etching from an etched region S.

That is, the semiconductor structure 120 may be insulated and protected by the passivation layer 163. In this case, the passivation layer 163 may also include an uneven structure due to the uneven structure of the semiconductor structure 120.

In addition, a second-first hole H2-1 may be formed such that the first end portion 151c is exposed, and a second-second hole H2-2 may be formed such that the second end portion 152c is exposed. That is, the second-first hole H2-1 may be formed by etching the channel layer 130 and the first insulating layer 161 from the passivation layer 163. The second-second hole H2-2 may be formed by etching the channel layer 130 from the passivation layer 163.

Referring to FIG. 20M, an operation of arranging first and second pads 181 and 182 in the etched region of the semiconductor structure 120 may be performed. In this case, the first and second pads 181 and 182 may include first regions 181a and 182a and second regions 181b and 182b.

Specifically, the first regions 181a and 182a may be disposed in the second-first and second-second holes H2-1 and H2-2. That is, the second regions 181b and 182b may be disposed to protrude from the first regions 181a and 182a disposed in the second-first and second-second holes H2-1 and H2-2 to the etched region of the semiconductor structure 120.

The first region 181a of the first pad 181 may be electrically connected to the first end portion 151c of the first interconnection line 151. The first region 181a may pass through the first insulating layer 161, the channel layer 130, and the passivation layer 163. The second region 181b of the first pad 181 may protrude outward from the passivation layer 163 and be disposed at the side portion of the semiconductor structure 120.

The first region 182a of the second pad 182 may be electrically connected to the second end portion 152c of the second interconnection line 152. The first region 182a may pass through the channel layer 130 and the passivation layer 163. The second region 182b of the second pad 182 may protrude outward from the passivation layer 163 and be disposed at the side portion of the semiconductor structure 120.

Meanwhile, in the drawings, although one first pad 181 and one second pad 182 are disposed, substantially, a plurality of first pads 181 and a plurality of second pads 182 may be present as in the semiconductor structures 120 and the first and second interconnection lines 151 and 152.

As described above, in the present invention, a semiconductor structure in a large unit may be formed, and the semiconductor structure may be isolated on the substrate 170 to be separated into the semiconductor structures 120 in a chip unit. In addition, peripheral portions of the semiconductor structures corresponding to a peripheral portion of the substrate 170 may be etched together, and the first and second pads 181 and 182 may be disposed in regions in which the semiconductor structure is etched. In this case, the first and second interconnection lines 151 and 152 electrically connected to the semiconductor structure 120 may be disposed to extend to a lower portion of the etched region. Therefore, connections between the first and second pads 181 and 182 and the interconnection lines can be easily performed.

That is, the plurality of semiconductor structures 120 may be disposed on one substrate 170, and the plurality of first pads 181 and the plurality of second pads 182 may be disposed along the peripheral portion of the substrate 170. In this case, one first pad 181 and one second pad 182 may be electrically connected to the plurality of semiconductor structures 120. In addition, the first and second interconnection lines 151 and 152 may be formed between the semiconductor structure 120 and the substrate 170.

Accordingly, wire bonding for connecting individual chips (semiconductor devices) on a substrate and a package substrate can be omitted to miniaturize a package. In addition, processability can be improved by shortening a process. In addition, a semiconductor region can be further expanded by saving an unnecessary space.

FIGS. 21A to 21D are views illustrating a method of manufacturing the semiconductor device package according to the third embodiment.

The method of manufacturing a semiconductor device package described above with reference to FIGS. 20A to 20I may be equally applied to the semiconductor device package according to the third embodiment. It should be understood that FIGS. 21A to 21D illustrate manufacturing processes after FIG. 20I.

Referring to FIG. 21A, an intermediate layer 164 may be disposed on an outermost surface of a first conductivity-type semiconductor layer 121. The intermediate layer 164 may be a thin film and may be formed through a deposition method, but the present invention is not limited to the method. The intermediate layer 164 may be disposed to overlap the outermost surface of the first conductivity-type semiconductor layer 121 in a direction (first or second direction described above) perpendicular to a thickness direction thereof. Accordingly, the intermediate layer 164 may reflect or block light emitted through the outermost surface of the first conductivity-type semiconductor layer 121 to prevent occurrence of optical interference with an adjacent semiconductor structure, thereby improving a contrast ratio.

In addition, the intermediate layer 164 may be made of any one selected from among metal, ceramic, and semiconductor materials. Preferably, the intermediate layer 164 may be made of a ceramic material to improve heat resistance of the semiconductor device package. For example, the intermediate layer 164 may include Si, SiC, TIN, $TiO_2$, or the like, but the present invention is not limited to such materials.

Referring to FIG. 21B, an operation of forming an uneven structure on a semiconductor structure 120 may be performed. Specifically, the uneven structure may be formed on the first conductivity-type semiconductor layer 121. Light extraction efficiency of the semiconductor device package can be improved due to the uneven structure. On the other hand, an uneven structure of a passivation layer 163 may be formed after both the intermediate layer 164 and the passivation layer 163 are disposed, but the present invention is not limited thereto.

Referring to FIG. 21C, an operation of arranging the passivation layer 163 on the semiconductor structure 120 and an exposed channel layer 130 and forming holes H2-1 and H2-2 such that end portions 151c and 152c of interconnection lines 151 and 152 are partially exposed may be performed. In this case, the holes H2-1 and H2-2 may be formed through etching from an etched region S.

That is, the semiconductor structure 120 may be insulated and protected by the passivation layer 163. In this case, the passivation layer 163 may also include the uneven structure due to the uneven structure of the semiconductor structure 120.

In addition, a second-first hole H2-1 may be formed such that a first end portion 151c is exposed, and a second-second hole H2-2 may be formed such that a second end portion 152c is exposed. That is, the second-first hole H2-1 may be formed by etching the channel layer 130 and a first insulating layer 161 from the passivation layer 163. The second-second hole H2-2 may be formed by etching the channel layer 130 from the passivation layer 163.

Referring to FIG. 21D, an operation of arranging first and second pads 181 and 182 in the etched region of the semiconductor structure 120 may be performed. In this case, the first and second pads 181 and 182 may include first regions 181a and 182a and second regions 181b and 182b.

Specifically, the first regions 181a and 182a may be disposed in the second-first and second-second holes H2-1 and H2-2, respectively. That is, the second regions 181b and 182b may be disposed to protrude from the first regions 181a and 182a disposed in the second-first and second-second holes H2-1 and H2-2 to the etched region of the semiconductor structure 120.

The first region 181a of the first pad 181 may be electrically connected to the first end portion 151c of the first interconnection line 151. The first region 181a may pass through the first insulating layer 161, the channel layer 130, and the passivation layer 163. The second region 181b of the first pad 181 may protrude outward from the passivation layer 163 and be disposed at a side portion of the semiconductor structure 120.

The first region 182a of the second pad 182 may be electrically connected to the second end portion 152c of the second interconnection line 152. The first region 182a may pass through the channel layer 130 and the passivation layer 163. The second region 182b of the second pad 182 may protrude outward from the passivation layer 163 and be disposed at the side portion of the semiconductor structure 120.

Meanwhile, in the drawings, although one first pad 181 and one second pad 182 are disposed, substantially, a plurality of first pads 181 and a plurality of second pads 182 may be present as in the semiconductor structures 120 and the first and second interconnection lines 151 and 152.

As described above, in the present invention, a semiconductor structure in a large unit may be formed, and the semiconductor structure may be isolated on the substrate 170 to be separated into the semiconductor structures 120 in a chip unit. In addition, peripheral portions of the semiconductor structures corresponding to a peripheral portion of the substrate 170 may be etched together, and the first and second pads 181 and 182 may be disposed in regions in which the semiconductor structure is etched. In this case, the first and second interconnection lines 151 and 152 electrically connected to the semiconductor structure 120 may be disposed to extend to a lower portion of the etched region. Therefore, connections between the first and second pads 181 and 182 and the interconnection lines can be easily performed.

That is, a plurality of semiconductor structures 120 may be disposed on one substrate 170, and the plurality of first pads 181 and the plurality of second pads 182 may be disposed along the peripheral portion of the substrate 170. In this case, one first pad 181 and one second pad 182 may be electrically connected to the plurality of semiconductor structures 120. In addition, the first and second interconnection lines 151 and 152 may be formed between the semiconductor structure 120 and the substrate 170.

Accordingly, wire bonding for connecting individual chips (semiconductor devices) on a substrate and a package substrate can be omitted to miniaturize a package. In addition, processability can be improved by shortening a process. In addition, a semiconductor region can be further expanded by saving an unnecessary space.

The above-described semiconductor device package is formed as a light-emitting device package and may be used as a light source of a lighting system. For example, the semiconductor device package may be used as a light source of an image display apparatus, a light source of a lighting device, or the like.

The semiconductor device package may be used as an edge-type backlight unit or a direct-type backlight unit when used as a backlight unit of the image display apparatus, and the semiconductor device package may be used in a lighting apparatus or as a bulb-type lighting device when used as the light source of the lighting device. In addition, the semiconductor device package may also be used as a light source of a mobile phone or a headlamp for a vehicle.

While the present invention has been mainly described with reference to the embodiments, it should be understood that the present invention is not limited to the disclosed embodiments and that various modifications and applications may be devised by those skilled in the art without departing from the gist of the present invention. For example, each component specifically shown in the embodiment may be modified and implemented.

Differences related to these modifications and applications should be construed as being within the scope of the present invention defined by the appended claims.

What is claimed is:

1. A semiconductor device package comprising:
a substrate;
a plurality of semiconductor structures disposed to be spaced apart from each other at a central portion of the substrate,
wherein the semiconductor structure is disposed on the substrate and comprises a first conductivity-type semiconductor layer, a second conductivity-type semiconductor layer disposed on the first conductivity-type semiconductor layer, and an active layer disposed between the first conductivity-type semiconductor layer and the second conductivity-type semiconductor layer;
a first recess formed to pass through the second conductivity-type semiconductor layer, the active layer and extends to a partial region of the first conductivity-type semiconductor layer;
a first electrode disposed on the first conductivity-type semiconductor layer and electrically connected to the first conductivity-type semiconductor layer;
a second electrode disposed below the second conductivity-type semiconductor layer and electrically connected to the second conductivity-type semiconductor layer;
a plurality of first interconnection lines disposed between the substrate and the plurality of semiconductor structures and electrically connected to the first conductivity-type semiconductor layer through the first electrode;
a plurality of second interconnection lines disposed between the substrate and the plurality of semiconductor structures and electrically connected to the second conductivity-type semiconductor layer through the second electrode; and
a reflective layer disposed between the second electrode and the second interconnection line,
wherein the first electrode is disposed in the first recess.

2. The semiconductor device package of claim 1, further comprising:
a passivation layer disposed on the semiconductor structure and comprising a plurality of layers; and
an intermediate layer disposed inside the passivation layer.

3. The semiconductor device package of claim 2, wherein the passivation layer is disposed on an outermost surface of the first conductivity-type semiconductor layer and a portion of an upper surface of the first conductivity-type semiconductor layer.

4. The semiconductor device package of claim 3, wherein the plurality of layers comprise:
a first passivation layer disposed to be in contact with the outermost surface and the portion of the upper surface of the first conductivity-type semiconductor layer;
a second passivation layer disposed on the first passivation layer,
wherein the intermediate layer is disposed between the first passivation layer and the second passivation layer.

5. The semiconductor device package of claim 2, wherein the intermediate layer extends from an outermost surface of the first conductivity-type semiconductor layer to an edge of the substrate.

6. The semiconductor device package of claim 2, wherein the intermediate layer comprises a plurality of layers and is made of any one selected from among metal, ceramic, and semiconductor materials.

7. The semiconductor device package of claim 2, wherein a ratio of a thickness of the intermediate layer to a maximum height of an outermost surface of the first conductivity-type semiconductor layer on a lower surface of the first conductivity-type semiconductor layer is in a range of 1:11.25 to 1:30.

8. The semiconductor device package of claim 2, further comprising:
a fluorescent layer disposed on the plurality of semiconductor structures and the passivation layer.

9. The semiconductor device package of claim 8, wherein a ratio of a maximum height of an outermost surface of the first conductivity-type semiconductor layer to a thickness of the fluorescent layer is in a range of 1:1.1 to 1:2.3.

10. The semiconductor device package of claim 1, further comprising:
a first insulating layer disposed between the first interconnection line and the second interconnection line;
a plurality of first pads electrically connected to the first interconnection lines; and
a plurality of second pads electrically connected to the second interconnection lines,
wherein the semiconductor structure is disposed between the first pad and the second pad.

11. The semiconductor device package of claim 10, wherein
the first interconnection line comprises a first through-portion, which passes through the active layer, the second conductivity-type semiconductor layer and the first insulating layer, and is electrically connected to the first electrode, a first end portion, which extends to an edge of the substrate and is electrically connected to the first pad, and a first connection portion, which disposed between the first through-portion and the end portion, and the second interconnection line comprises a second end portion that extends to the edge of the substrate and is electrically to the second pad.

12. The semiconductor device package of claim 1, wherein an upper surface of the first conductivity-type semiconductor layer comprises a first surface, a second surface disposed below the first surface, and an inclined surface positioned between the first surface and the second surface.

13. The semiconductor device package of claim 12, wherein a ratio of a height from a lower surface of the first conductivity-type semiconductor layer to the second surface to a height from the lower surface exposed by the first recess to the first surface is in a range of 1:1 to 1:10.

14. The semiconductor device package of claim 12, wherein a length of the second surface in a direction perpendicular to a thickness direction of the semiconductor structure is in a range of 10 μm to 150 μm.

15. The semiconductor device package of claim 1, wherein a maximum height of an outermost surface of the first conductivity-type semiconductor layer is in a range of 1 μm to 3 μm.

16. The semiconductor device package of claim 1, wherein a length ratio of a minimum separation distance between adjacent semiconductor structures to a maximum width of the semiconductor structure is in a range of 1:5 to 1:20.

17. The semiconductor device package of claim 1, wherein an upper surface of the first conductivity-type semiconductor layer is formed with an uneven structure.

* * * * *